(12) United States Patent
Grushkowitz et al.

(10) Patent No.: US 10,174,970 B2
(45) Date of Patent: Jan. 8, 2019

(54) SUN TRACKING SOLAR ENERGY COLLECTION SYSTEM WITH TORSION LOCK

(71) Applicant: SunPower Corporation, San Jose, CA (US)

(72) Inventors: Tyler Grushkowitz, Hayward, CA (US); Matthew Scott Lambert, Oakland, CA (US); Brian Wares, Berkeley, CA (US); Mark Adam Schimelpfenig, Hayward, CA (US); Nicholas James McKibben, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 202 days.

(21) Appl. No.: 15/261,062

(22) Filed: Sep. 9, 2016

(65) Prior Publication Data

US 2018/0073773 A1 Mar. 15, 2018

(51) Int. Cl.
*F24J 2/38* (2014.01)
*H02S 20/32* (2014.01)
*F24S 50/20* (2018.01)
*F24S 30/425* (2018.01)
*F24J 2/52* (2006.01)
(Continued)

(52) U.S. Cl.
CPC .............. *F24S 50/20* (2018.05); *F24S 30/425* (2018.05); *H02S 20/32* (2014.12); *F24S 2030/11* (2018.05); *F24S 2030/15* (2018.05)

(58) Field of Classification Search
CPC ...... F24S 50/20; F24S 30/425; F24S 2030/15; F24S 2030/11; F24S 2030/12; F24S 2030/134; F24S 2030/136; F24S 2025/6003; H02S 20/32
USPC ................. 126/606, 607, 577, 576; 24/326; 248/689; 279/2.19, 146
See application file for complete search history.

(56) References Cited

U.S. PATENT DOCUMENTS

| 9,184,324 B2 | 11/2015 | Wares et al. |
| 2009/0095283 A1* | 4/2009 | Curtis .................... F24S 30/425 126/704 |

(Continued)

FOREIGN PATENT DOCUMENTS

JP 61194511 A * 8/1986 ............. G05D 3/105

*Primary Examiner* — Gregory Huson
*Assistant Examiner* — Daniel E Namay
(74) *Attorney, Agent, or Firm* — Oblon, McClelland, Maier & Neustadt, L.L.P.

(57) ABSTRACT

A rotation locking device for use in a row-level sun tracking solar energy collection system includes a housing, a first locking member, a second locking member, and an actuator. The housing is configured to be mounted to a pile and configured to permit a torque tube to extend through the housing. The first locking member has a plurality of circumferentially spaced projections attached to and rotatable with the torque tube. The second locking member is connected to the housing and has a plurality of mating elements for engaging projections of the first locking member. The actuator is configured to relatively move the first and second locking members between an unlocked position in which the mating elements are disengaged from the projections and a locked position in which the mating elements are engaged with the projections to inhibit rotation of the torque tube with respect to the housing.

20 Claims, 30 Drawing Sheets

(51) Int. Cl.
*F24J 2/54* (2006.01)
*F24S 30/00* (2018.01)

(56) References Cited

U.S. PATENT DOCUMENTS

| | | | |
|---|---|---|---|
| 2011/0219759 A1* | 9/2011 | Blitz | F16M 11/08 |
| | | | 60/327 |
| 2012/0216852 A1* | 8/2012 | Almy | H02S 20/32 |
| | | | 136/246 |
| 2013/0152915 A1* | 6/2013 | Marten | F16C 19/50 |
| | | | 126/600 |
| 2014/0182577 A1* | 7/2014 | Linderman | H02S 20/32 |
| | | | 126/593 |
| 2016/0195303 A1 | 7/2016 | Lambert et al. | |
| 2017/0179872 A1* | 6/2017 | Almy | H02S 20/32 |
| 2018/0062564 A1* | 3/2018 | Grushkowitz | F16H 35/18 |

* cited by examiner

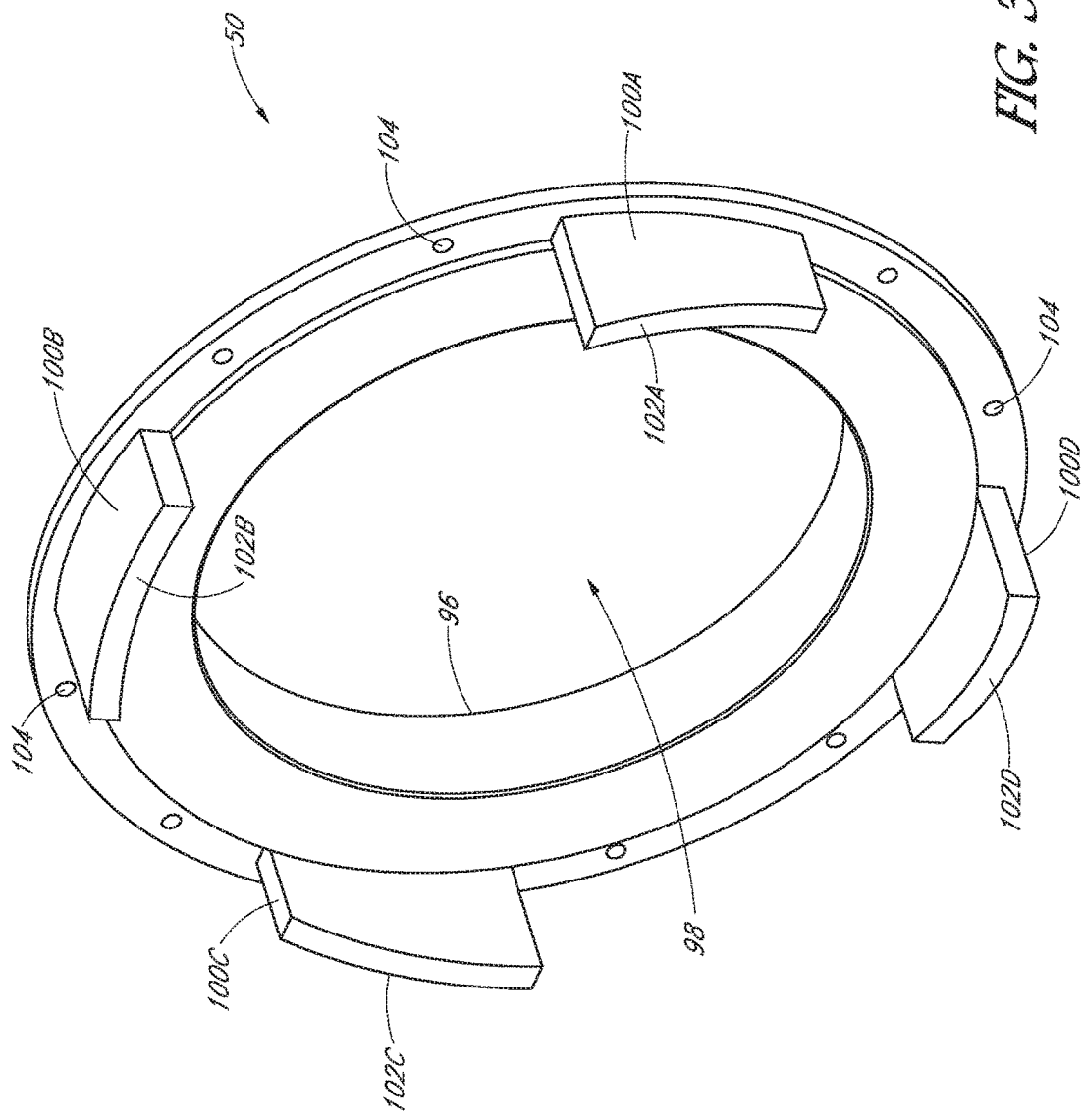

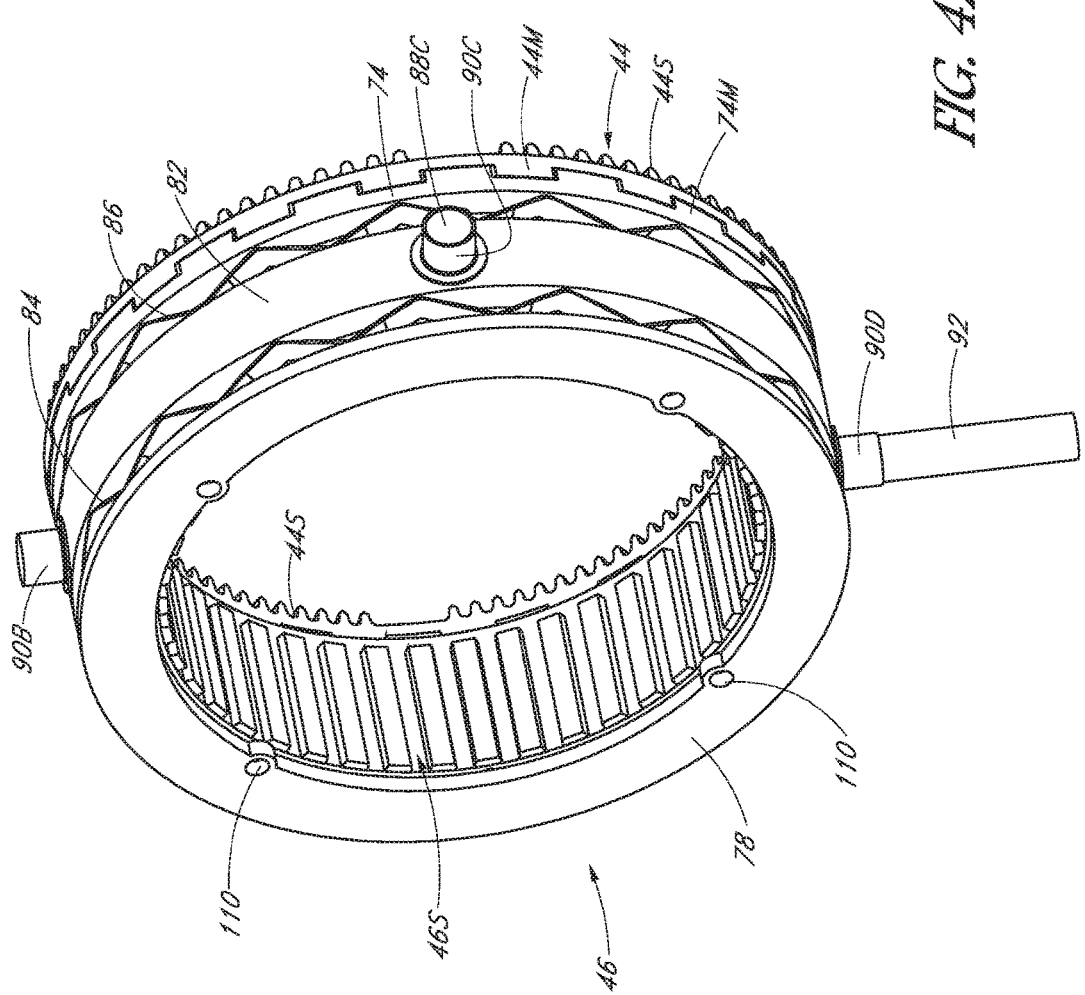

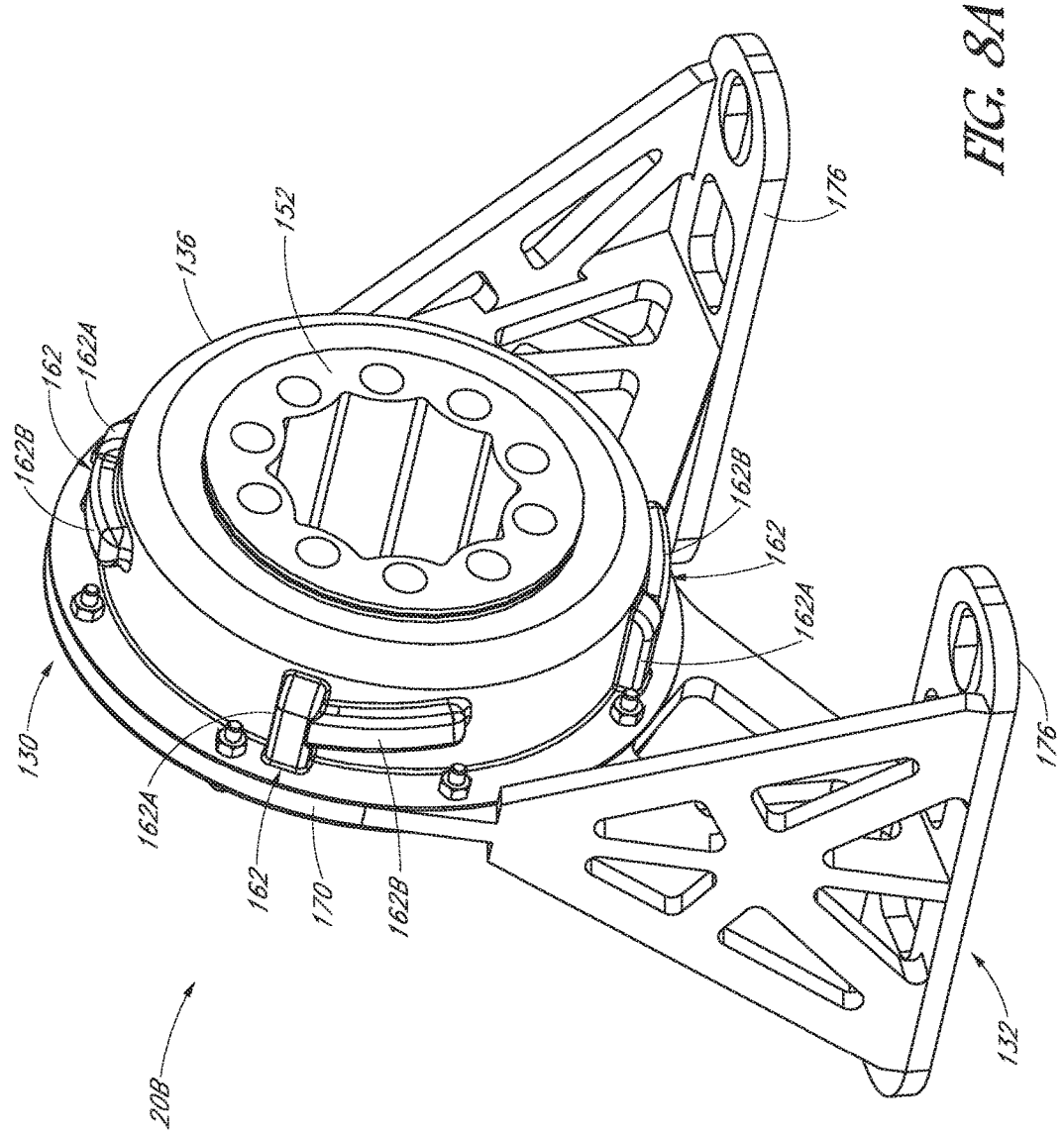

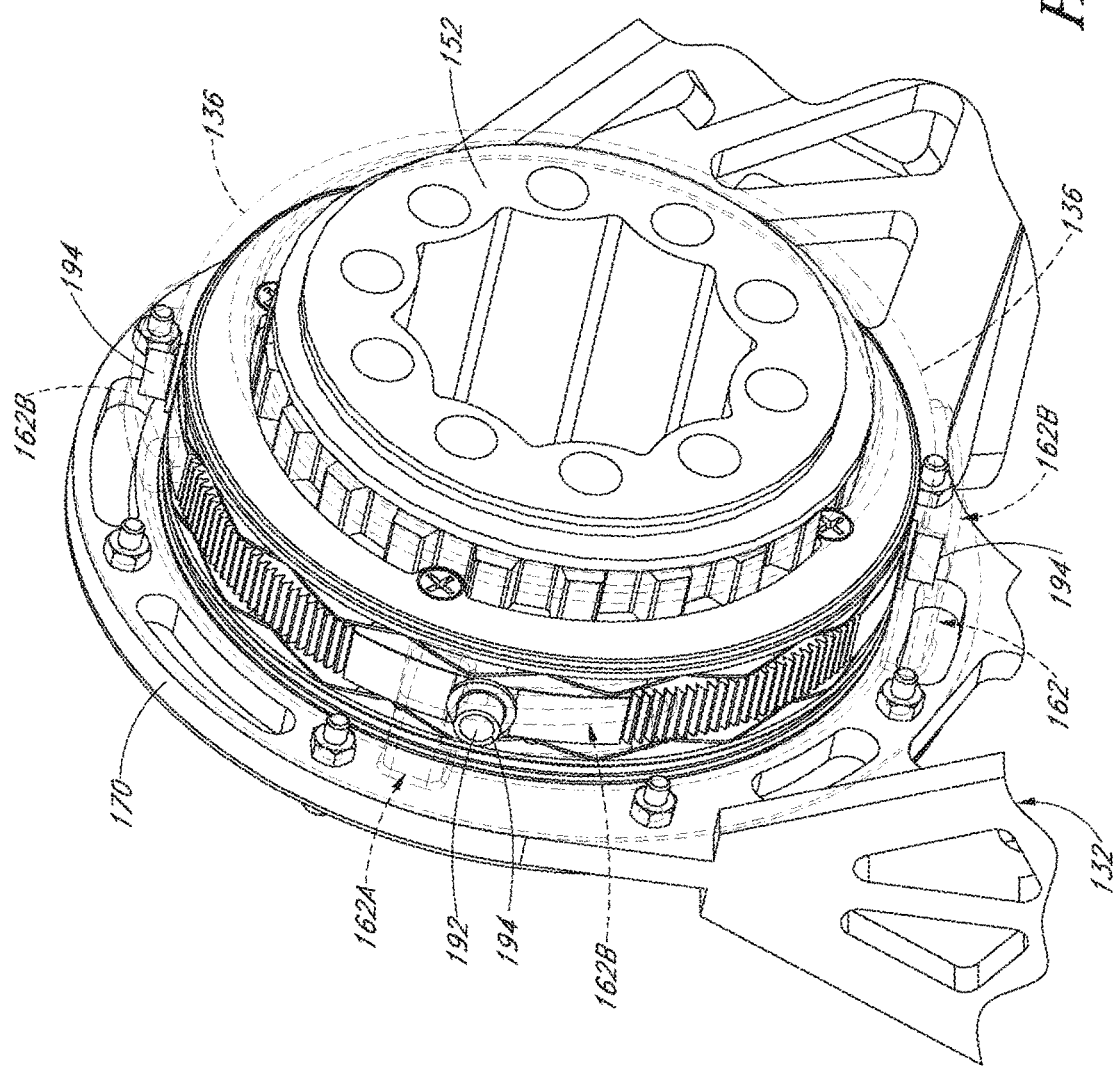

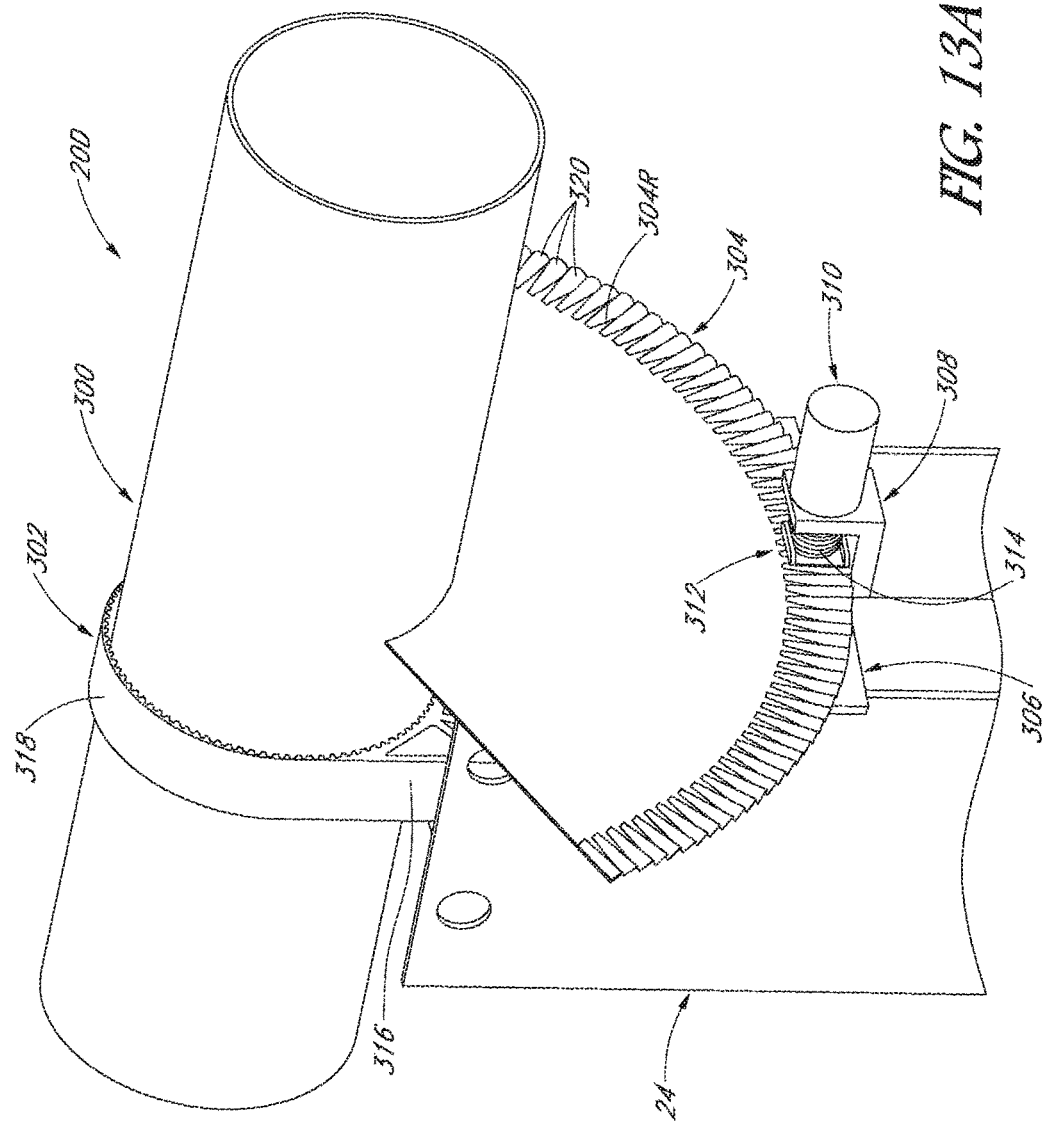

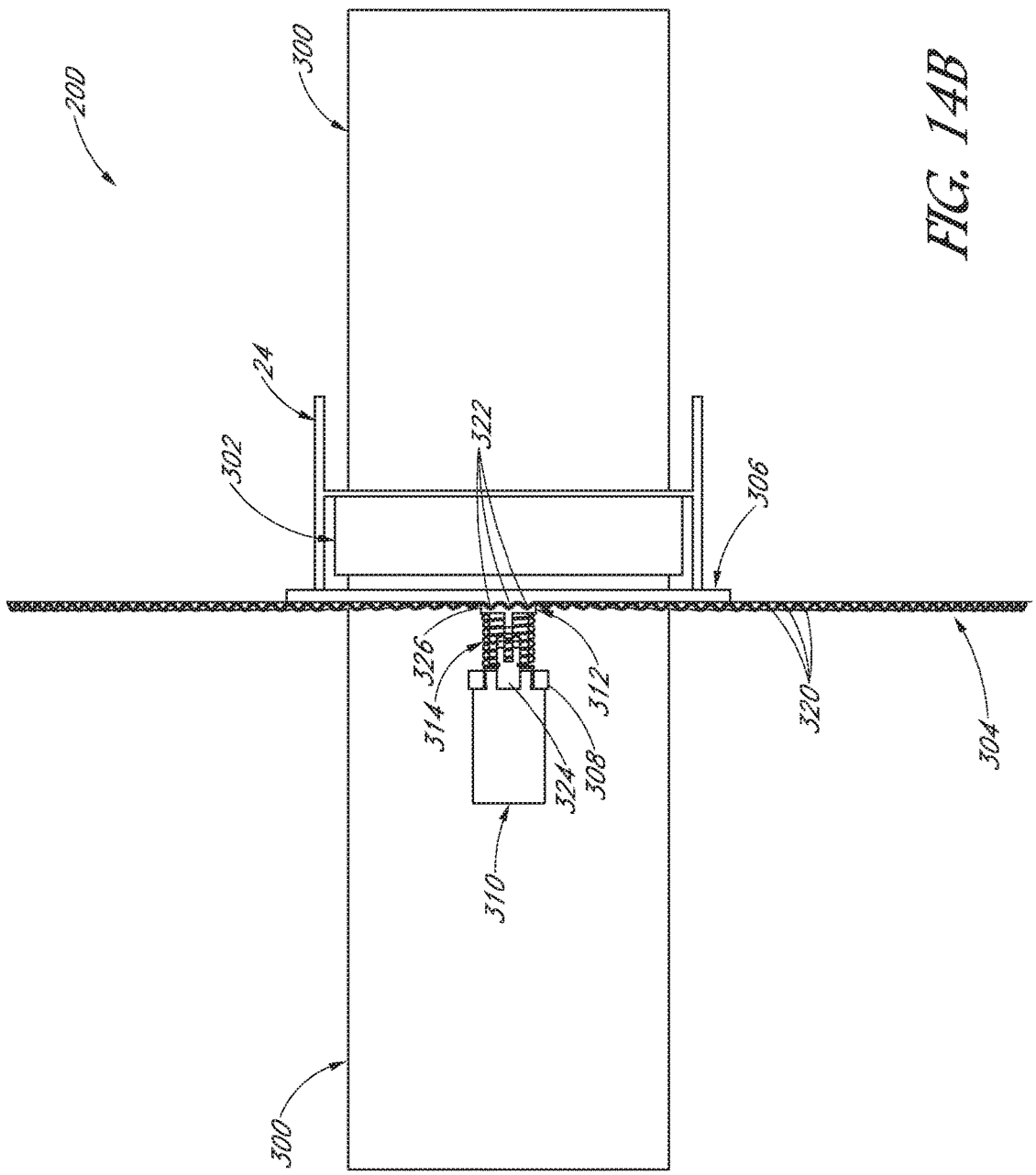

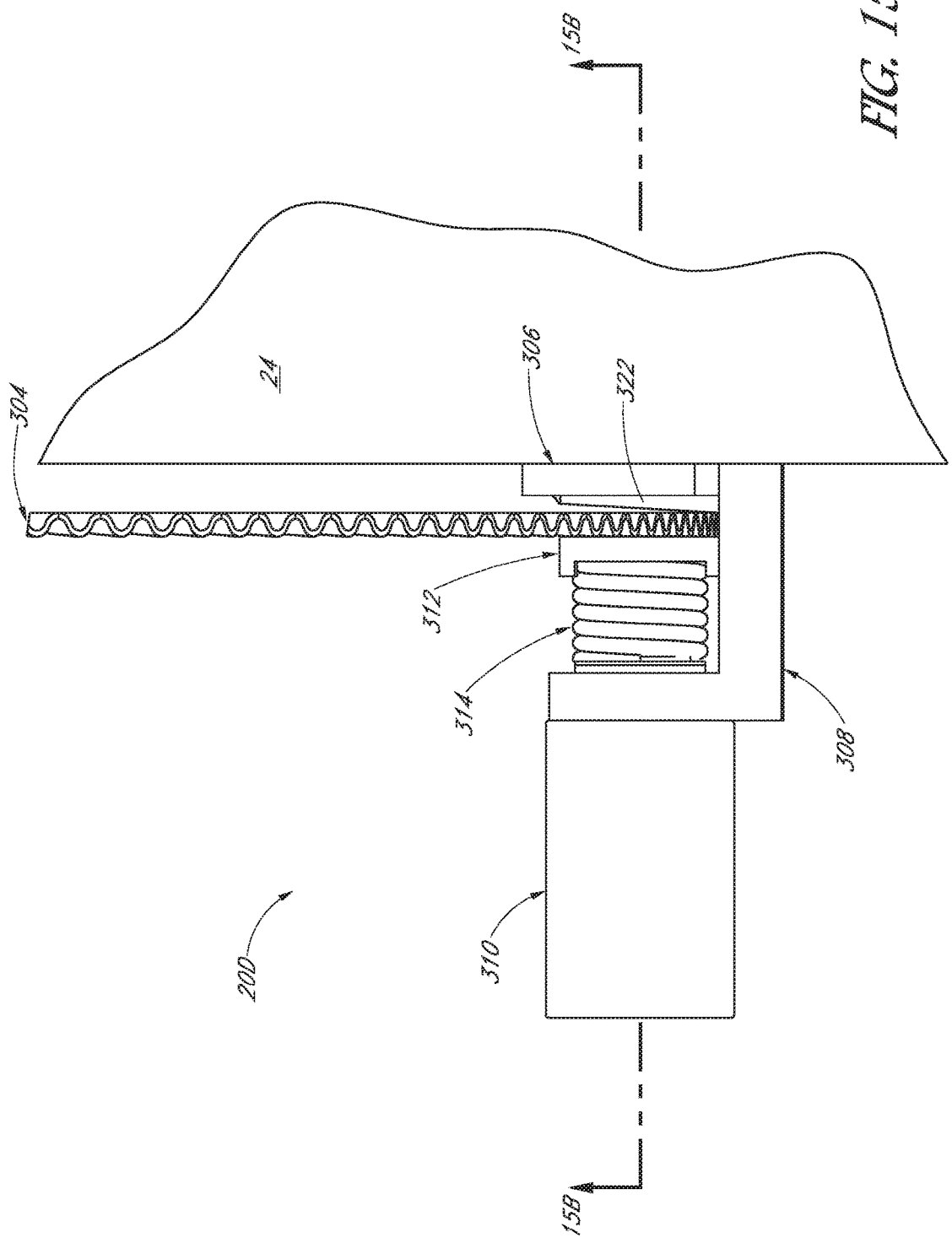

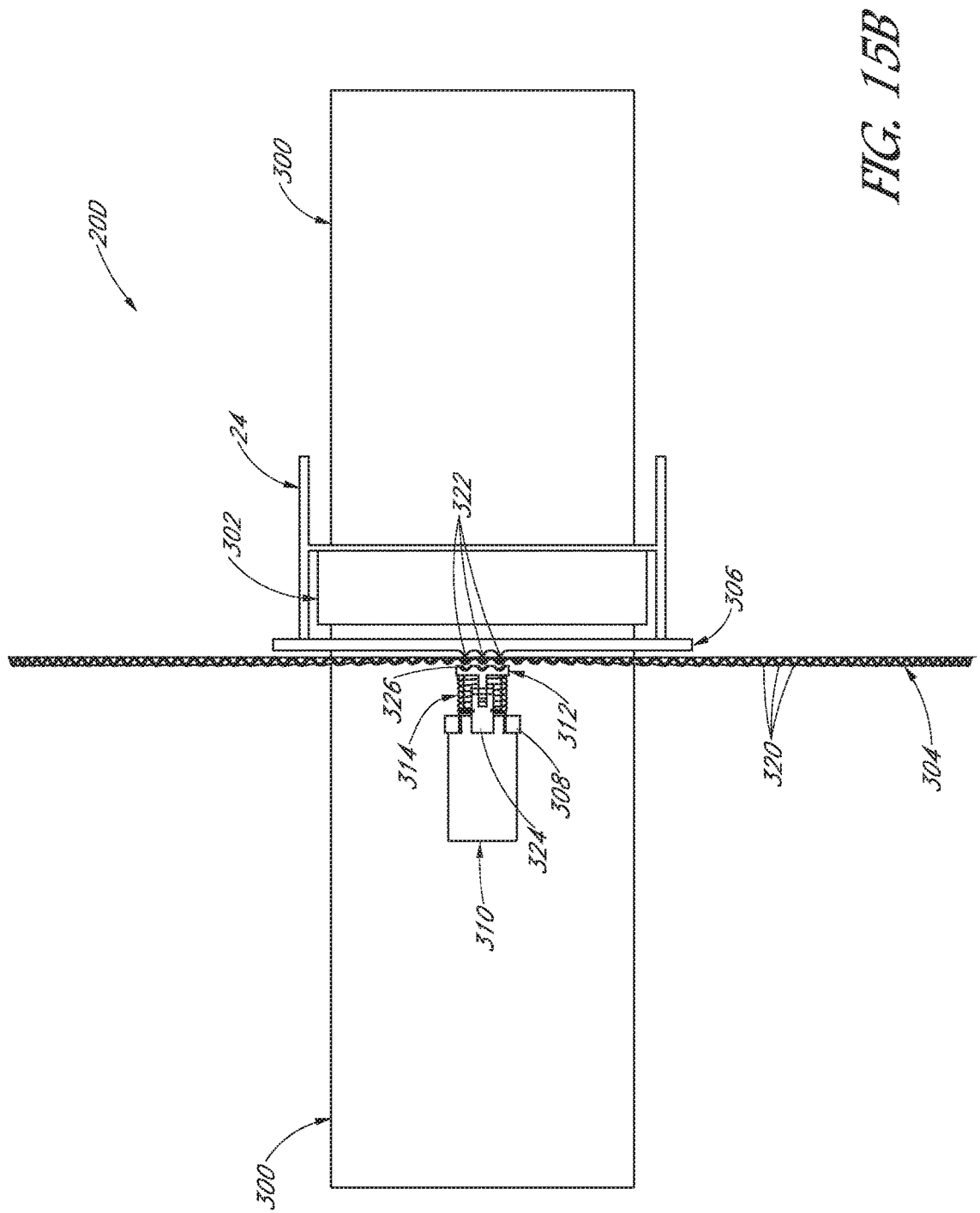

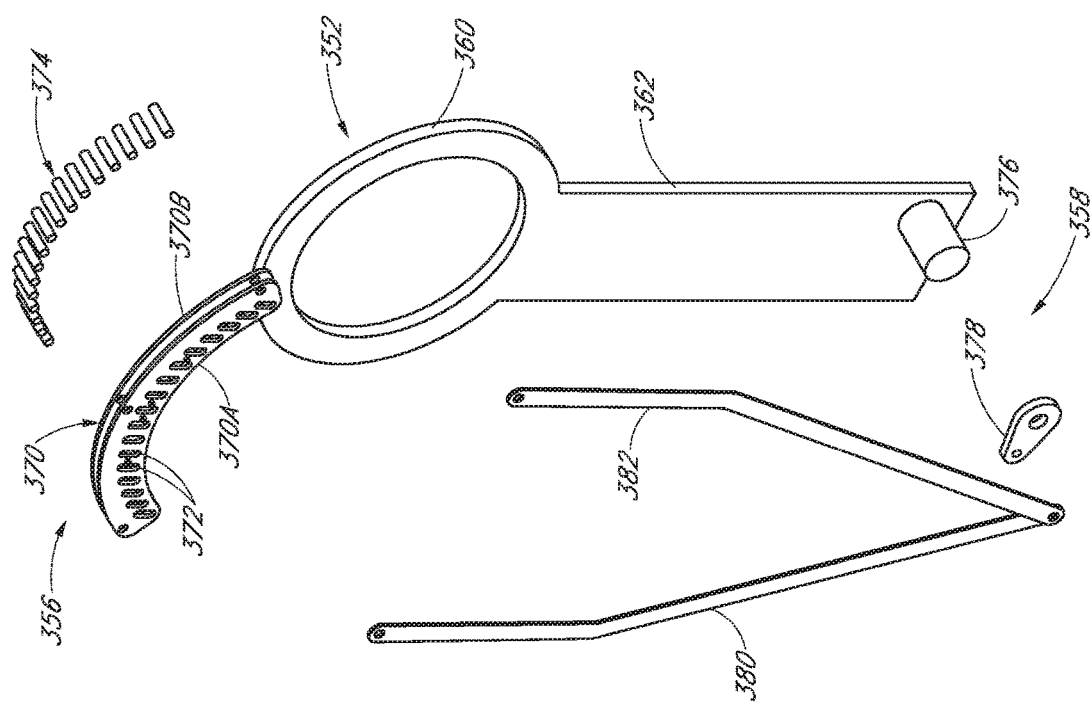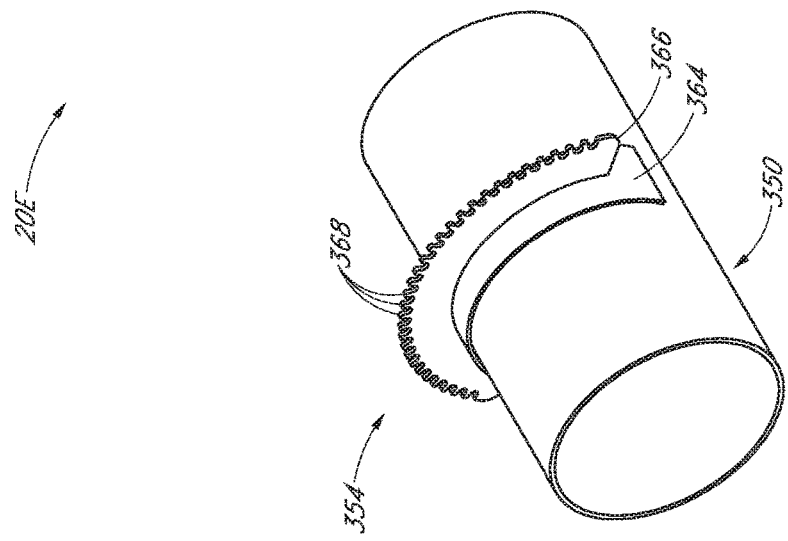
FIG. 16B

SUN TRACKING SOLAR ENERGY COLLECTION SYSTEM WITH TORSION LOCK

BACKGROUND

Sun tracking solar energy collection systems include hardware for automatically adjusting the position of solar energy collecting devices to track the sun as it moves across the sky. Some of these sun tracking systems include a single row or multiple rows of solar energy collection devices supported on a pivoting shaft (or torque tube). A number of tube sections can be connected together to form an elongated torque tube that extends along a horizontal axis.

A drive mechanism is typically connected to the torque tube at the center of the span of the torque tube. The drive mechanism for a single torque tube can be, for example, an electric servomotor slewing drive mounted on one of the piles that support the torque tube. Solar collection devices, such as un-concentrated photovoltaic modules, concentrated photovoltaic modules, or thermal solar collection devices, are mounted to the torque tube along its span. The drive mechanism is periodically activated to rotate the torque tube so that the solar collection devices track movement of the sun during the course of a day. During periods when it is not activated, the drive mechanism holds the torque tube at its current rotated position.

Some sun tracking solar energy collection systems make use of a number of rows arranged parallel to one another, with a master motor device that is connected by links to the drive mechanism for each torque tube of the parallel rows. With this type of "ganged" system, a reduced number of motorized drive devices are needed. The drive mechanisms linked to the master drive motor are typically located at the center of the span of their associated torque tubes.

Row level actuated sun tracking solar energy collection systems utilizing torque tubes are flexible structures, and the solar energy collecting devices connected to the torque tube are typically in the form of panels that act as large airfoils when subjected to high winds. As a result, these systems are vulnerable to resonant motion in high wind conditions because the row is only locked in rotation at the center, where the drive mechanism is located.

SUMMARY

A row level sun tracking solar energy collection system includes a torque tube, first and second piles for supporting the torque tube at first and second spaced positions, respectively, a plurality of solar energy collection devices connected to the torque tube, a drive mechanism mounted on the first pile and configured to rotate the torque tube, and a rotation locking device mounted on the second pile. The rotation locking device includes a housing, a first locking member, a second locking member, and an actuator. The torque tube extends through the housing. The first locking member has a plurality of circumferentially spaced protrusions attached to and rotatable with the torque tube. The second locking member is connected to the housing and has a plurality of mating elements for engaging the protrusions of the first locking member. The actuator is configured to relatively move the first and second locking members between an unlocked position in which the mating elements are disengaged from the protrusions, and a locked position in which the mating elements are engaged with the protrusions to inhibit rotation of the torque tube with respect to the housing.

A rotation locking device includes a housing, an axle that extends through the housing, a first locking member, a second locking member, and an actuator. The first locking member has a plurality of circumferentially spaced projections attached to and rotatable with the axle. The second locking member is connected to the housing and has a plurality of mating elements for engaging the projections of the first locking member. The actuator is configured to relatively move the first and second locking members between an unlocked position in which the mating elements are disengaged from the projections and a locked position in which the mating elements are engaged with the projections to inhibit rotation of the axle with respect to the housing.

BRIEF DESCRIPTION OF THE DRAWINGS

FIG. 3 is an isometric view of a housing end cap of the face spline torsion lock of FIGS. 2A-2C.

FIGS. 4A and 4B are isometric views of a slider assembly and slider face spline plate of the face spline torsion lock of FIGS. 2A-2C.

FIG. 8A is an assembled isometric view of another embodiment of a face spline torsion lock.

FIG. 11A is an enlarged assembled isometric view of the face spline torsion lock of FIGS. 8A and 8B, with a housing cover in phantom.

FIG. 13A is an assembled isometric view of a ruffle row torsion lock.

FIGS. 14A and 14B are side and sectional views, respectively, of the ruffle row torsion lock in an unlocked state.

FIGS. 15A and 15B are side and sectional views, respectively, of the ruffle row torsion lock in a locked state.

FIG. 16B is an exploded isometric view of the falling pins torsion lock.

DETAILED DESCRIPTION

Figure 1:
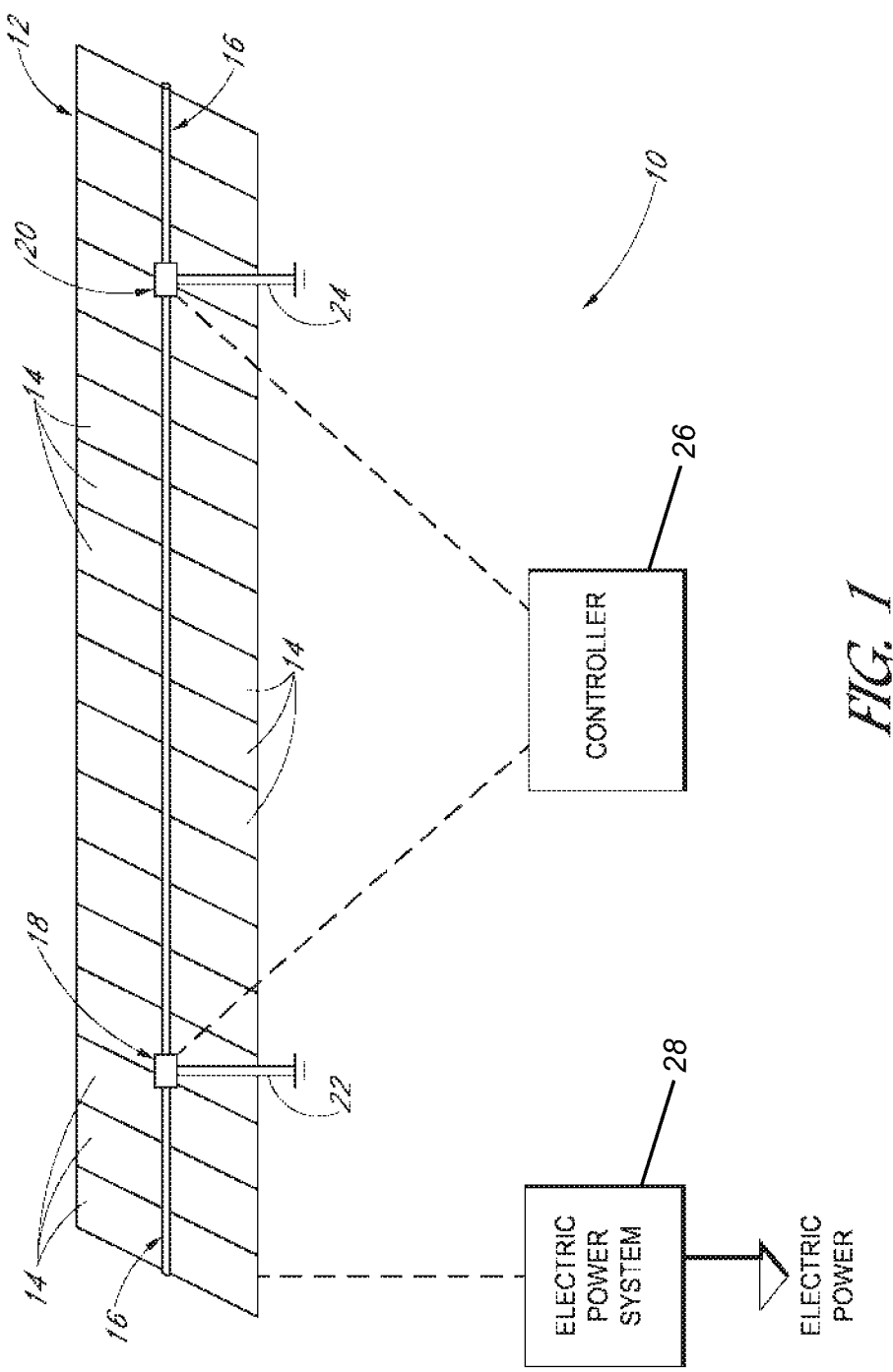
FIG. 1 is a diagram of a single axis row level sun tracking solar energy collection system that includes a pile mounted rotation locking device.

Solar Energy Collection System 10 (FIG. 1)

Row level sun tracking solar energy collection systems include solar collecting devices (such as solar panels) connected to a torque tube, which is rotated by a slew drive mechanism mounted on a pile. To reduce vulnerability of the system to resonant motion in high winds, a rotation locking device (i.e. a torsion lock) mounted on another pile is used to selectively lock the torque tube. The rotation locking device includes a housing through which a portion of the torque tube extends, a first locking member connected to the torque tube, a second locking member connected to the housing, and an actuator that relatively moves the locking members between an unlocked disengaged position and a locked engaged position.

FIG. 1 schematically illustrates solar energy collection system 10, which is a row level, single axis, sun tracking solar energy collection system. System 10 includes solar collection array 12 of solar energy collection modules 14, torque tube 16, drive 18, torsion lock 20, piles 22 and 24, controller 26, and electrical power system 28.

Solar collection array 12 includes a plurality of solar collection modules 14. Each module 14 can include a plurality of solar collecting devices (such as un-concentrated photovoltaic devices, concentrated photovoltaic devices, or thermal energy collection devices) incorporated into a laminate and encircled by a peripheral frame. Alternatively or additionally, the system 10 may include frameless modules 14 that do not include a peripheral frame.

Solar energy collecting modules 14, which are typically in the form of large panels, are mounted side-by-side along the length or span of torque tube 16. Modules 14 are connected to torque tube 16, so that all of modules 14 will rotate together as torque tube 16 rotates. Torque tube 16 is an elongated metal tube, typically made of steel. Torque tube 16 is designed to minimize the amount metal required in order to reduce the weight and thus the energy required to rotate torque tube 16 and attached solar energy collecting devices 12. Typically a series of individual torque tube sections that are connected together end-to-end to form torque tube 16. The rotational axis of torque tube 14 is generally horizontal and is aligned so that energy collection devices 12 can rotate together as the sun travels across the sky from East to West during the day.

Torque tube 16 is supported above the ground by a support assembly that includes piles 22 and 24. Piles 22 and 24 can be in the form of any type of pile, for example those types of piles which can be "pile-driven" into the ground for providing structural support. Although only piles 22 and 24 are shown in FIG. 1, in other embodiments additional piles may be provided at spaced intervals along the span of torque tube 16 to support bearings through which torque tube 16 passes.

Drive 18 is mounted at an upper end of pile 22, and lock 20 is mounted at an upper end of pile 22. In the embodiment shown in FIG. 1, drive 18 and pile 22, are located closer to the left end of system 10 than to the right end. Torsion lock 20 is mounted on pile 24, and located at a position that is closer to the right end of system 10 in FIG. 1. The positions and spacing of drive 18 and lock 20 are selected to maximize the length of system 10 and torque tube 16 while making use of only a single drive and a single torsion lock.

Although FIG. 1 illustrates a single row level collection system, in other embodiments multiple rows of solar collection arrays are arranged in parallel with one another. In a multiple row system, each row can have an independent drive 18 to rotate its torque tube 16. Alternatively, a common motor can be used to mechanically power drives 18 of the respective rows. In either case, each row also includes one or more torsion locks 20.

Drive 18 is connected to torque tube 16 and is configured to pivot or rotate torque tube 16 about its axis in order to cause modules 14 to track the movement of the sun. In this embodiment, torque tube 16 is arranged generally horizontally, and modules 14 are connected to each other and to torque tube 16. Drive 18 is typically a slewing drive that can hold radial and axial loads, and in response to a command from controller 26 will transmit torque to cause torque tube 16 and modules 14 to rotate about the axis of torque tube 16.

Operation of drive 18 and lock 20 is coordinated by controller 26. Controller 26 can receive inputs indicating wind and other weather conditions, and can control drive 18 and lock 20 to operate system 10 differently depending upon wind and weather conditions. For example, in one embodiment, controller 26 controls and coordinates operation of drive 18 and lock 20 so that only drive 18 is operated during low wind conditions. In this unlocked tracking mode, maintaining rotational position of torque tube 16 is solely under the control of drive 18. During the unlocked tracking mode, lock 20 remains in an unlocked state, so that it does not interfere with rotation of torque tube 16.

Under medium wind conditions, controller 26 operates drive 18 and lock 20 in an unlocked/locked tracking mode. In this mode, lock 20 is normally in a locked position except when the position of modules 14 needs to be changed. To change position of modules 14, controller 26 causes lock 20 to disengage and activates drive 18 so that torque tube 16 can be rotated to a new position, and then held in that position through the combination of drive 18 and lock 20.

Under high wind conditions, system 10 is operated in a locked, stowed mode. Under high wind conditions, controller 26 causes drive 18 to rotate torque tube 20 and modules 14 to a stowed position. Controller 26 then causes drive 18 and lock 20 to maintain torque tube 16 in a locked state so that torque tube 16 and modules 14 will not rotate.

Electrical power system 28 is connected to array 12 to convert the outputs of modules 14 to electrical power. That electric power can be provided by electric power system 28 to power lines connected for example, to an electrical power grid. System 28 can include a utility power source, a meter, electrical panel with the main disconnect, electrical junction, electrical loads, and/or an inverter.

Lock 20 meets a number of design requirements. It is capable of locking torque tube 16 at multiple rotational positions. Lock 20 offers resolution of the locking angle, so that precise positioning of the solar energy collecting modules 14 can be achieved as the sun moves across the sky during the day. Lock 20 is able to lock and unlock torque tube 16 under load. The actuation speed of lock 20 is sufficient to allow precision positioning of torque tube 16 and attached modules 14. The actuation power required for lock 20 to stay engaged is minimized so that excessive power requirements for the locking function are avoided.

Lock 20 allows torque tube 16 to locate freely in both a clockwise in a counterclockwise direction when lock 20 is disengaged. Lock 20 is capable of the locking rotation of torque tube 16 in both clockwise and counterclockwise directions. In addition, lock 20 allows axial movement of torque tube 16 with respect to lock 20 in order to accommodate system tolerances during the assembly the system, and also to allow for thermal expansion of torque tube 16 that can occur during use of the system over time. Lock 20 is mounted to pile 24 and provides a direct load path from torque tube 16 to pile 24.

Lock 20 can take a number of different forms. In the following description, five embodiments are described: face spline torsion lock 20A (FIGS. 2A-7), face spline torsion lock 20B (FIGS. 8A-11), splined collar torsion lock 20C (FIGS. 12A-12C), ruffle row torsion lock 20D (FIGS. 13A-15B), and falling pins torsion lock 20E (FIGS. 16A-17B). Each of these embodiments of torsion lock 20 includes a housing, a first locking member, a second locking member, and an actuator. The housing is mounted on pile 24, as shown in FIG. 1. A portion of torque tube 16 (referred to as an axle) extends in an axial direction through the housing of torsion lock 20. The first locking member has a plurality of circumferentially spaced projections. These projections are connected to and are rotatable with torque tube 16. The second locking member is connected to the housing and has a plurality of meeting elements for engaging the projections of the locking members. The actuator is configured to relatively move the first and second locking members between an unlocked position and a locked position. In the unlocked position, the mating elements of the second locking member are disengaged from the projections of the first locking member. As a result, torque tube 16 can rotate freely in either direction with respect to the housing. In the locked position, the mating elements of the second locking member are engaged with the projections of the first locking member. As a result, rotation of torque tube 16 with respect to the housing is inhibited.

Face Spline Torsion Lock 20A (FIGS. 2A-7)

Figure 2A:
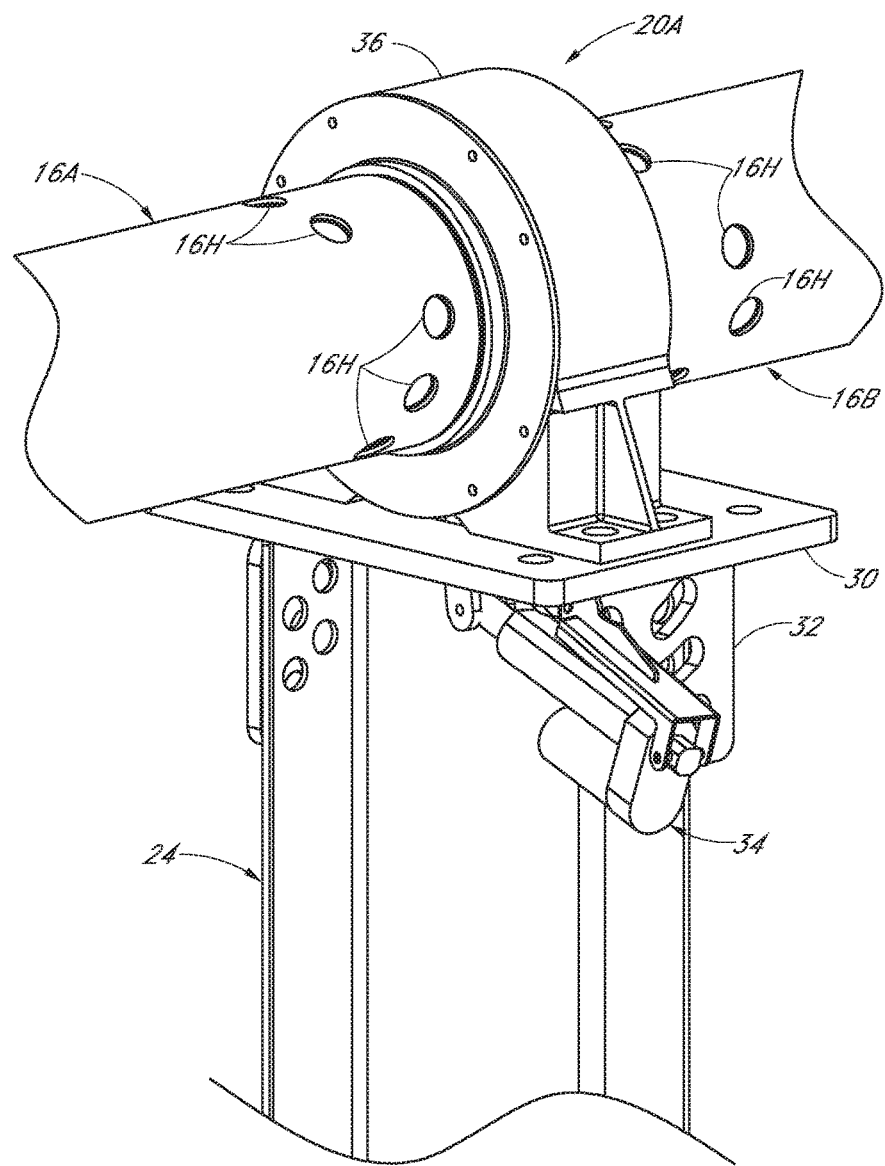
FIG. 2A is an assembled isometric view of a face spline torsion lock mounted on a pile and connected between torque tube sections.
Figure 2B:
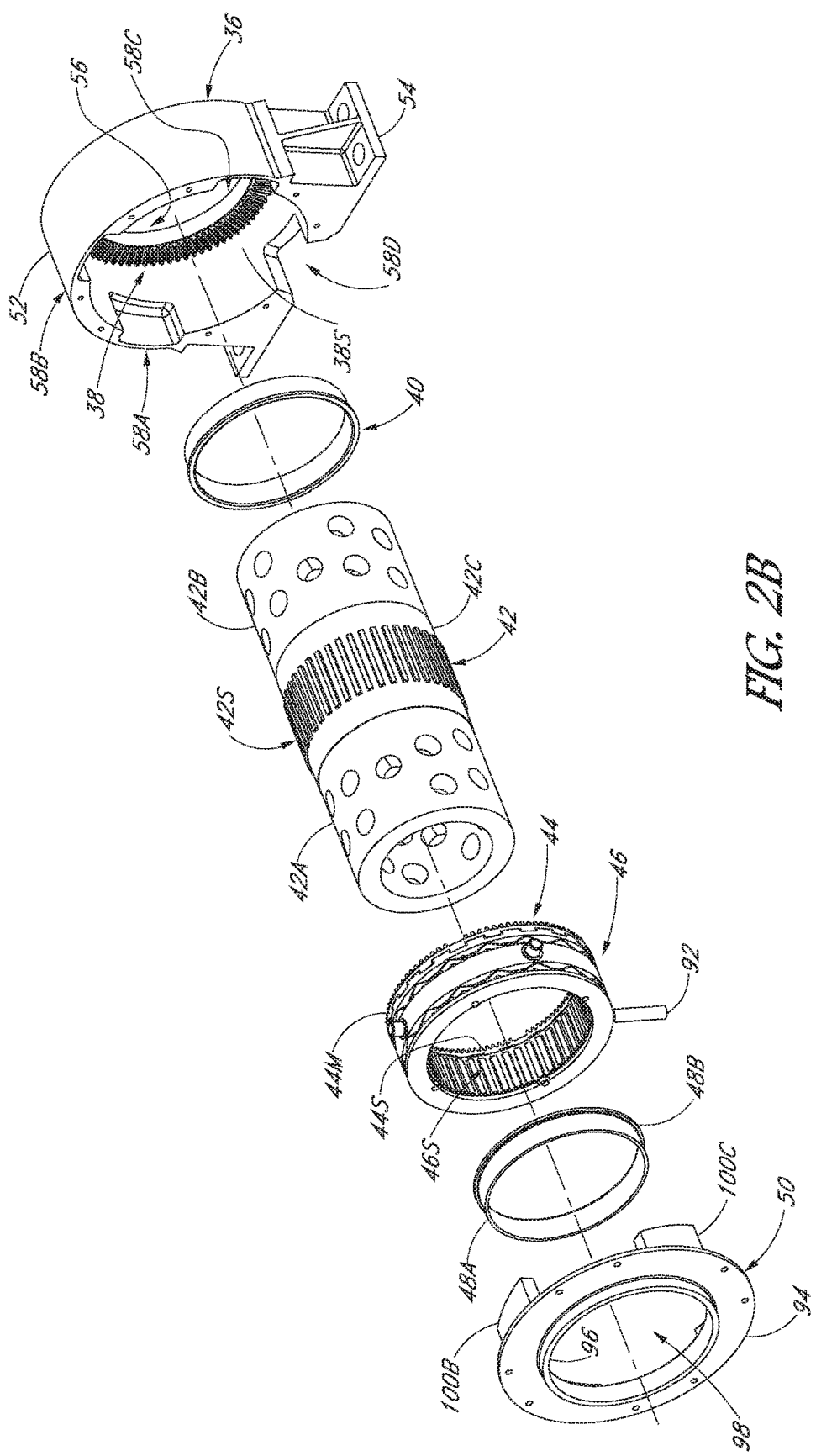
FIG. 2B is an exploded isometric view of the face spline torsion lock.
Figure 2C:
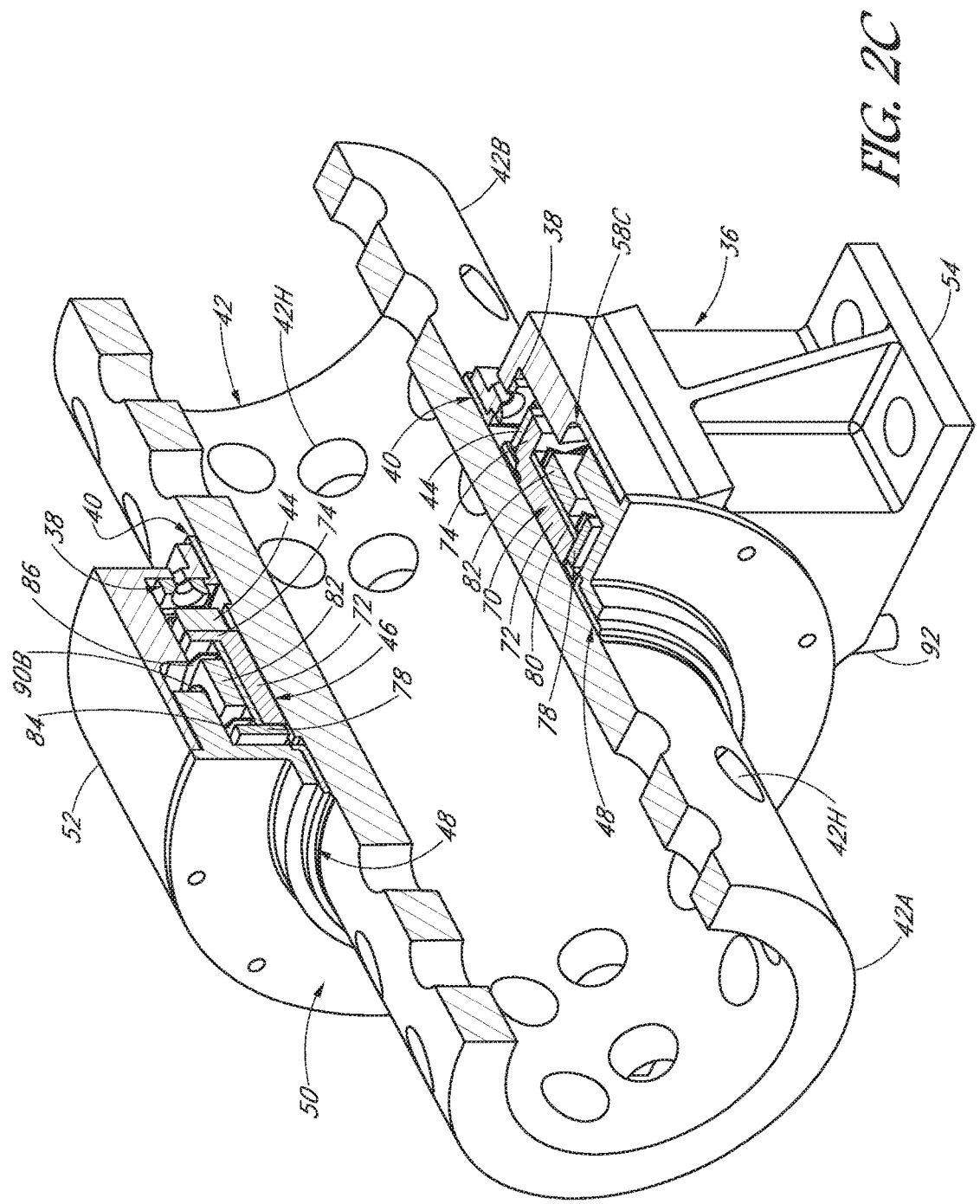
FIG. 2C is a partially sectioned isometric view of the face spline torsion lock.

FIGS. 2A-2C show lock 20A, which features a face spline locking mechanism. FIG. 2A shows lock 20A mounted on pile 24 and connected to sections 16A and 16B of torque tube 16. FIG. 2B is an exploded isometric view of lock 20A, and FIG. 2C is an assembled isometric view of lock 20A with a partial section to show internal components of lock 20A.

FIG. 2A shows torque tube sections 16A and 16B, lock 20A, piling 24, pile cap 30, actuator mounting bracket 32, and linear actuator 34. Lock 20A is mounted on pile cap 30, which is located at the top end of pile 24. Torque tube sections 16A and 16B are connected to lock 20A though using mounting holes 16H in the side walls of torque tube sections 16A and 16B.

Linear actuator 34 is positioned below pile cap 30 and is mounted to pile 24 by mounting bracket 32. Linear actuator 34 is coupled to lock 20A to move lock 20A between a locked state and an unlocked state. Linear actuator is capable of holding lock 20A in either the locked or the unlocked state without continued application of power to linear actuator 34.

As shown in FIGS. 2B and 2C, lock 20A includes housing 36, housing face spline plate 38, housing axle bearing 40, axle 42, slider face spline plate 44, slider assembly 46, and end cap axle bearing 48, and housing end cap 50. Housing face spline plate 38 is mounted within housing 36 and is held in place by screws and mating mounting splines on the inner surface housing 36 and the back surface of plate 38, housing axle bearing 48 is mounted in an opening defined by housing 38 and housing face spline plate 38. Slider face spline plate 44 is mounted on an end of slider 46 facing housing face spline plate 38. Slider assembly 46 and slider face spline plate 44 are mounted on axle 42, and rotate with axle 42. End cap axle bearing 48 is mounted in and extends through housing end cap 50. When lock 20A is assembled, housing end cap 50 is attached to housing 36. End 42A of axle 42 extends out through bearing 48 and housing end cap 50, and is attached to torque tube section 16A. End 42B of axle 42 extends out though bearing 40 and housing 36 and is attached to torque tube section 16B. As a result, axle 42 forms a portion of torque tube 16. Slider assembly 46 and slider face spline plate 44 are positioned on center section 42C of axle 42, and are located within housing 36.

Housing 36 includes cylindrical housing body 52, base 54, central opening 56, pockets 58A-58C, and slot 58D. Pockets 58A-58C are located on the inner surface of housing body 52 to at three spaced locations 90° apart. Slot 58D is positioned at the bottom of housing body to 90° away from pockets 58A and 58C.

Housing face spline plate 38 is mounted to the inner end surface of housing body 52. Face spline plate 38 surrounds central opening 56 of housing 36 and faces slider assembly 46.

Housing axle bearing 40 is an annular plastic ring that is positioned in the central opening 56 of housing 36. Section 42B of axle 42 extends through bearing 40 and extends out of housing 36 for connection with torque tube section 16B.

Axle 42 includes end portions 42A and 42B and central portion 42C. End portions 42A and 42B contain mounting holes 42H which can be aligned with mounting holes 16H in torque tube sections 16A and 16B to allow insertion of fasteners through holes 42H and 16H to connect axle 42 to torque tubes 16A and 16B. When connected, axle 42 and torque tube sections 16A and 16B become a part of torque tube 16, so that torque tube 16 extends through housing 36.

Central section 42C of axle 40 contains circumferentially spaced axial spines 42S on its outer surface. Spines are used to connect axle 42 to slider assembly 46, so that slider assembly 46 and axle 42 rotate together. Slider assembly 46 is movable axially over splines 42S with respect to axle 42 between an unlocked position (in which slider face spine plate 44 and housing face spline plate 38 are disengaged) and a locked position in which plates 44 and 38 are engaged).

Slider face spline plate 44 is attached to slider assembly 46. The surface of slider face spline plate 44 that faces housing face spline plate 38 has radially extending circumferentially spaced radial splines 44S which mate with radial splines 38S of housing face blind plate 38 when plate 44 is brought into engagement with plate 38.

On the opposite side of plate 44 which faces slider assembly 46, mounting splines 44M are circumferentially positioned. Splines 44M are radially oriented, and are shaped to conform to and engage with slider assembly 46.

Slider assembly 46 includes slider 70 (which includes slider body 72, slider end flange 74, and axially extending mounting splines 46S), slider end plate 78, slider bearing 80, collar 82, collar springs 84 and 86, collar guides 88A-88C, collar guide bearings 90A-90D, and collar guide drive arm 92.

End cap axle bearing 48 includes sleeve 48A and flange 48B. End cap axle bearing 48 is made of a low friction plastic material.

FIG. 3 shows a rear or inside surface view of housing end cap 50. Housing and cap 50 includes circular endplate 94, annular flange 96, central opening 98, and tabs 100A-100D. Central opening 98 is sized to receive axle bearing sleeve 48A, with flange 48B contacting the inner surface of circular endplate 94. Tabs 100A-100D extend from the inner surface of endplate 94 in a direction toward housing 36 and are sized to fit within corresponding pockets 58A-58C and slot 58D, respectively, of housing 36. Tabs 100A-100D, include angled surfaces 102A-102D (shown in FIG. 7) that define, along with similar angled surfaces of pockets 58A-58C and slot 58D, guide tracks or ramps for each of collar guides 88A-88C and collar guide drive arm 92. Holes 104 in the peripheral rim of endplate 94 provide passages for screws to be inserted to attach housing end cap 50 to housing 36.

Figure 4B:
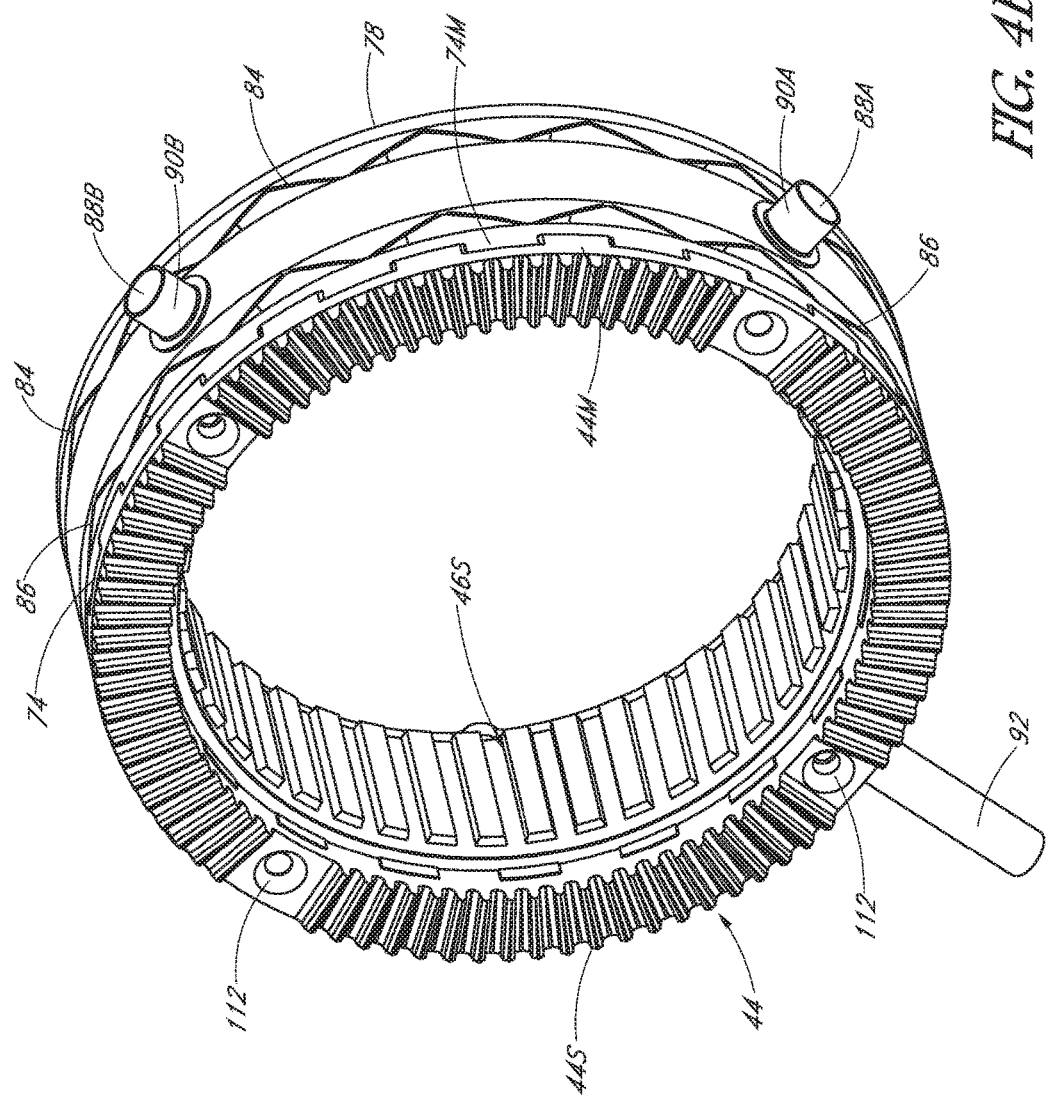
Figure 5:
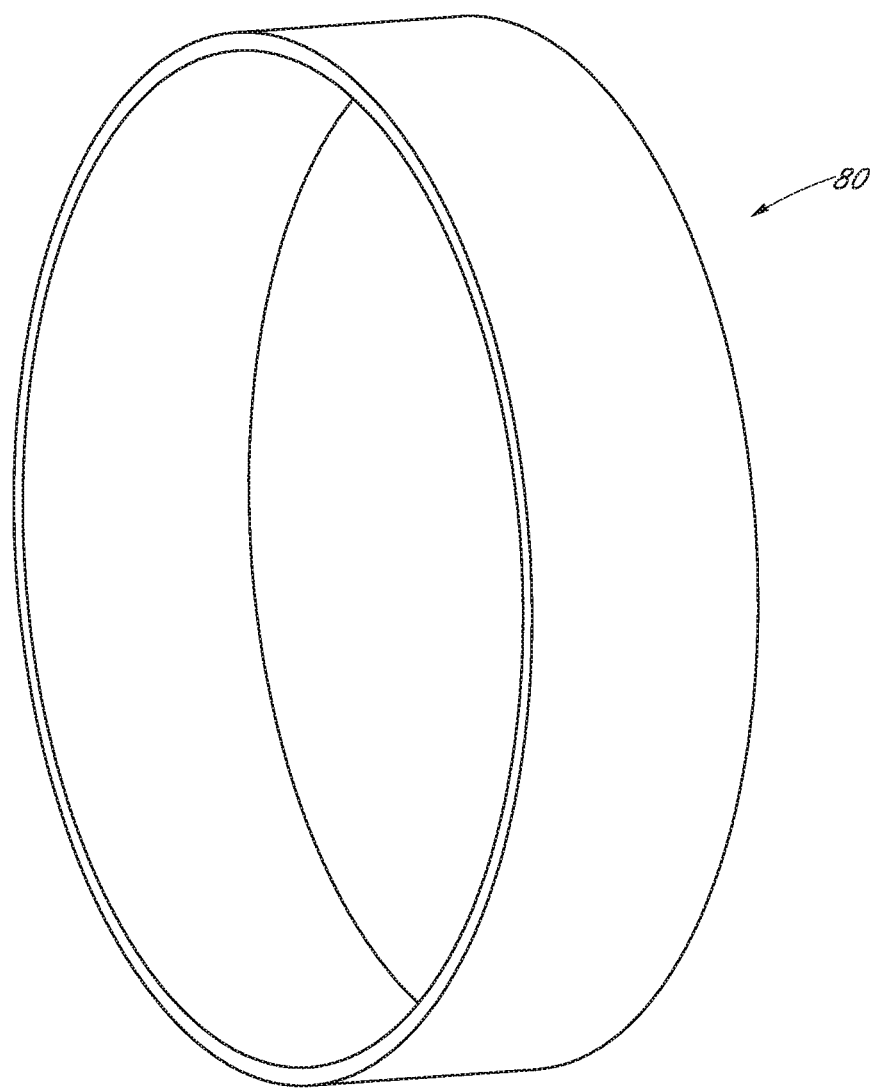
FIG. 5 is an isometric view of a slider and slider end cap of the slider assembly of FIGS. 4A and 4B.

Details of slider assembly 46 and slider face spline plate 44 are seen in FIGS. 4A, 4B, 5, 6, and 7. FIGS. 4A and 4B show slider assembly 46 from two different directions. In FIG. 3A, slider assembly 46 is viewed with slider end plate 78 facing the viewer and slider face spline plate 44 facing away from the viewer. In FIG. 4B, slider face spline plate 44 faces the viewer, and slider end plate 78 faces away from the viewer.

In FIG. 4A, slider end plate 78 is shown attached to slider 70. Screw holes 110 in plate 78 are aligned with threaded holes in slider body 72 so that screws (not shown) can be used to attach slider end plate 78 to slider 70.

Collar 82 and collar springs 84 and 86 are mounted between slider end plate 78 and slider end flange 74 of slider 70. Slider bearing 80 (shown in FIG. 5) is positioned between the outer surface of slider body 72 and the inner surfaces of collar 82 and collar springs 84 and 86. Slider bearing 80, which is made of a low friction plastic material, allows rotation of collar 82 with respect to slider 70 without significant friction. Spring 84 is positioned between collar 82 and slider end plate 78. Collar spring 86 is positioned between collar 84 and slider end flange 74.

Figure 6:
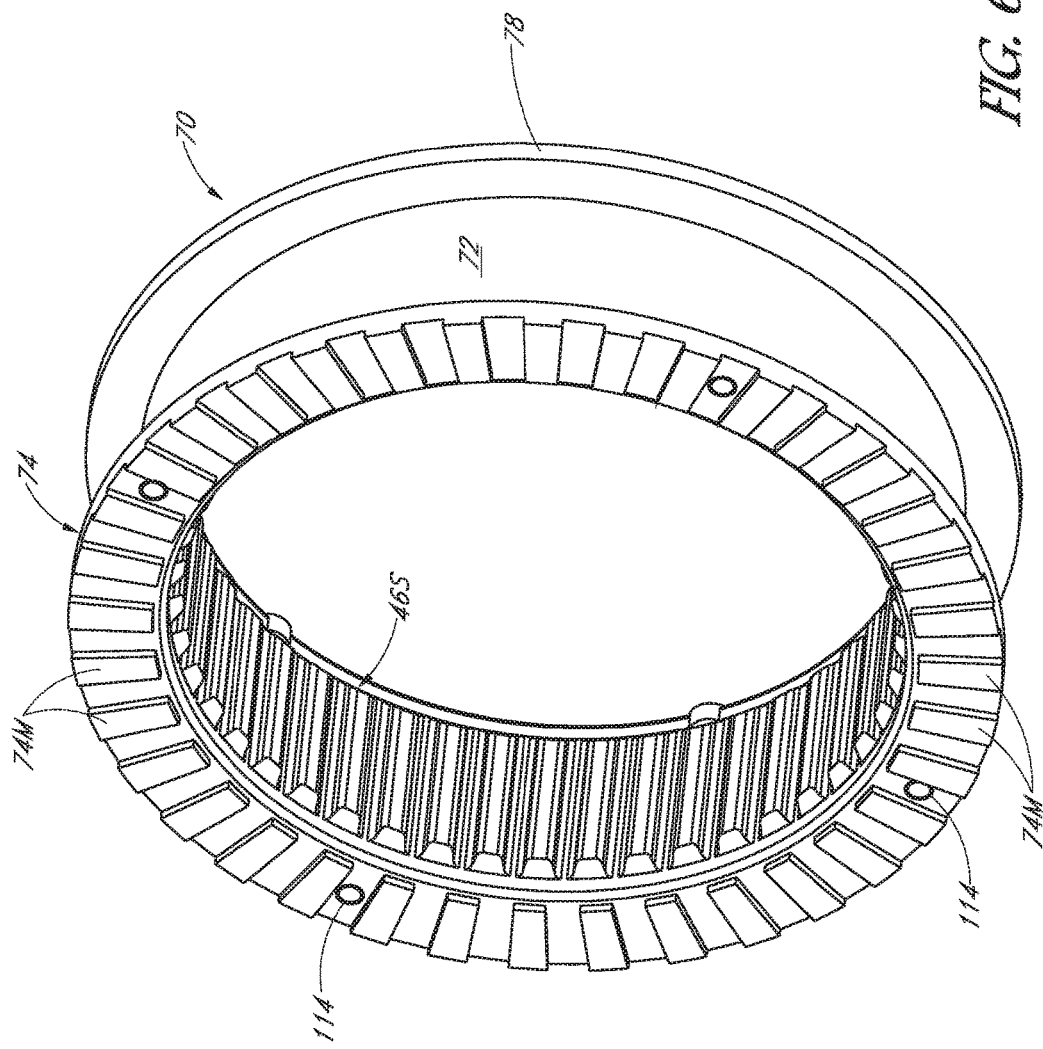
FIG. 6 is an isometric view of a collar assembly of the slider assembly of FIGS. 4A and 4B.

FIG. 6 shows only slider 70 and slider end plate 78. As shown in FIG. 6, slider end flange 74 includes radial mounting splines 74M, which are shaped to mate with mounting splines 44M of slider face spline plate 44. Mounting holes 112 of slider face spline plate 44 align with threaded holes 114 of slider end flange 74, so that screws (not shown) can be used attach slide face spline plate 44 to slider end flange 74.

Figure 7:
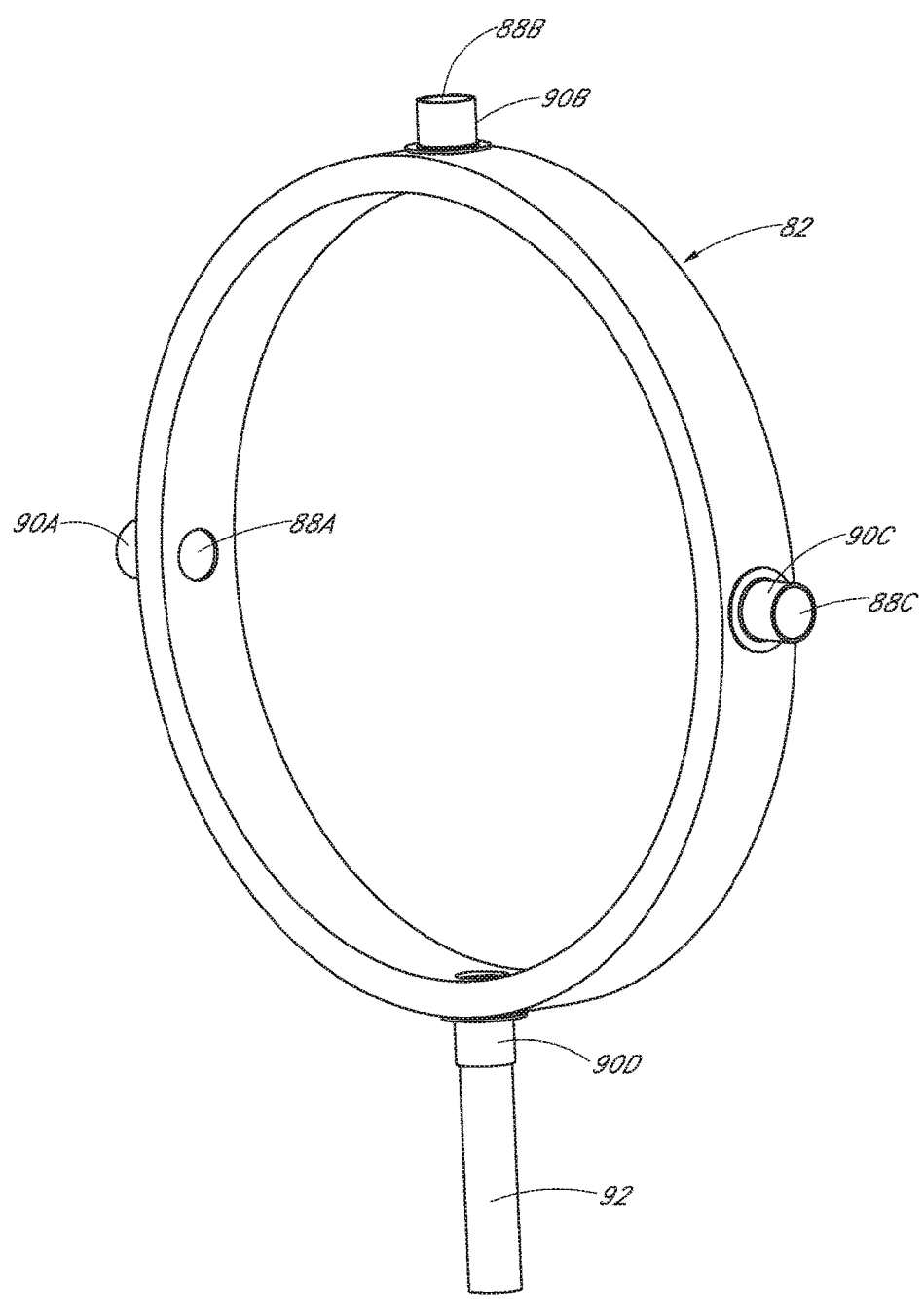
FIG. 7 is an isometric view of a slider bearing of the slider assembly of FIGS. 4A and 4B.

As shown in FIG. 7, collar 82 is a ring that is sized to mount over slider bearing 80 and slider body 72 of slider 70. Collar guides 88A-88C and collar guide drive arm 92 extend radially outward from collar 82. Collar guide bearings 90A-90D are mounted on each of collar guides 88A-88C and drive arm 92, respectively, and provide low friction contact between collar guide bearings 88 and the ramps defined pockets 58A-58C and slot 58D surfaces of housing 36 and tabs 100A-100D of housing end cap 50, when collar 82 is rotated by actuator 34 from a locked position to an unlocked position or from an unlocked position to a locked position.

Mounting splines 46S on the inner surface of slider body 72 mate with mounting splines 42S on the outer surface of central section 42C of axle 42. Mounting splines 42S and 46S cause slider 70, slider end cap 78 and axle 42 to rotate together, while allowing slider assembly 46 to move axially with respect to axle 42.

Lock 20A has two states: a locked state and an unlocked state. Actuator 34 causes changes between the two states by moving drive arm 92 in either a clockwise or a counterclockwise direction. This causes rotation of collar 82, which transfers axial force to slider 70 that moves slider face spline plate 44 either into engagement or out of engagement with housing face spline plate 38.

Lock 20A is in the locked state when slider face spline plate 44 is in engagement with housing face spline plate 38. The locking face splines of housing face spline plate 38 and slider face spline plate 44 are complementary to one another. They will mate to inhibit relative movement of plates 38 and 44 in the circumferential direction when the locking face splines 38S and 44S are engaged.

The unlocked state occurs when slider face spline plate 44 is axially spaced from housing base spline plate 38. In the unlocked state, splines 38S of plate 38 and splines 44S of plate 44 are not in engagement.

Movement of slider face spline plate 44 axially between the engaged locked position and the disengaged unlocked position is achieved by rotation of collar 82 with respect to slider 70 of slider assembly 46. Collar drive arm 92 is linked to actuator 34. Movement of linear actuator 34 causes movement of drive arm 92, which in turn causes rotation of collar 82 with respect to slider 70 of slider assembly 46. As collar 82 is rotated, collar guides 88A-88C travel in guide path ramps which are defined by the space between the angled surfaces of pockets 58A-58C and angled surfaces 102A-102C of tabs 100A-100C. Similarly, rotation of collar causes guide rotation arm 92 to travel in the guide path ramp defined between the angled surface of slot 58D and angled surface 102D of tab 100D. The guide path ramps have both a circumferential and an axial component. Movement of drive arm 92 in a clockwise direction causes rotation of collar 82 in a clockwise direction. This clockwise rotation of collar 82 causes collar guides 88A-88C to move in a clockwise direction and also in an axial direction toward housing face spline plate 38 in housing 36. The rotation of collar 82 in a clockwise direction, therefore, applies an axial force through collar 82 and collar spring 86 toward housing face spline plate 38 until slider face spline plate 44 is in engagement with housing face spline plate 38. At the end of rotation of collar in the clockwise direction, lock 20A is in the locked state.

Rotation of collar drive arm 92 in the counterclockwise direction causes collar 82 to rotate in the counterclockwise direction and causes collar guides 88A-88C and collar drive arm 92 to follow the guide tracks in a counterclockwise and rearward axial direction so that slider assembly 46 and slider face spline plate 44 move away and out of engagement from housing face spline plate 38. At the end of the rotation of collar 82 in the counterclockwise direction, lock 20A is in the unlocked state.

Lock 20A is an active mechanism that it can be placed near the end of a role of a single axis sun tracking solar energy collection system and can be used to lock the row in rotation. Lock 20a can be activated or deactivated in any rotational position. Lock 20A is activated by small linear actuator 34, which moves drive arm 92 so that drive arm 92 and collar guides 88A-88C follow guide path ramps located in housing 36. The movement of drive arm 92 and collar guides 88A-88C along the ramps increases mechanical advantage. Very little force is required to activate or deactivate lock 20A, because the angles of face splines 38S and 44S are such that the normal force, friction force, and row torque cancel out any row torque.

Lock 20A utilizes one stationary part (the housing assembly formed by housing 36 and housing end cap 50) and two moving parts (axle 42 and slider assembly 46). Housing 36 and housing end cap 50 are stationary and support axle 44 with two plastic bearings (housing axle bearing 40 and end cap axle bearing 48). Slider assembly 46 is free to move axially, but is tied in rotation to axle 42 by axial splines 42S and 46S. Axle 42 is free to rotate freely, unless slider assembly 46 is locked to housing 36. Slider assembly 46 locks when actuator 34 causes slider face spline plate 44 on slider assembly 46 into engagement with housing face spline plate 38 that is attached to housing 36. Slider assembly 46 contains two wave springs 84 and 86 that sandwich collar 82. This allows lock 20A to be activated at any position, and then fully engage when axle 42 rotates into a position where splines 38S of housing face spline plate 38 and splines 44S of slider face spline plate 44 are aligned in a mating position. Lock 20A can be deactivated and will unlock when torque is removed from the row.

Face Spline Torsion Lock 20B (FIGS. 8A-11B)

Figure 8B:
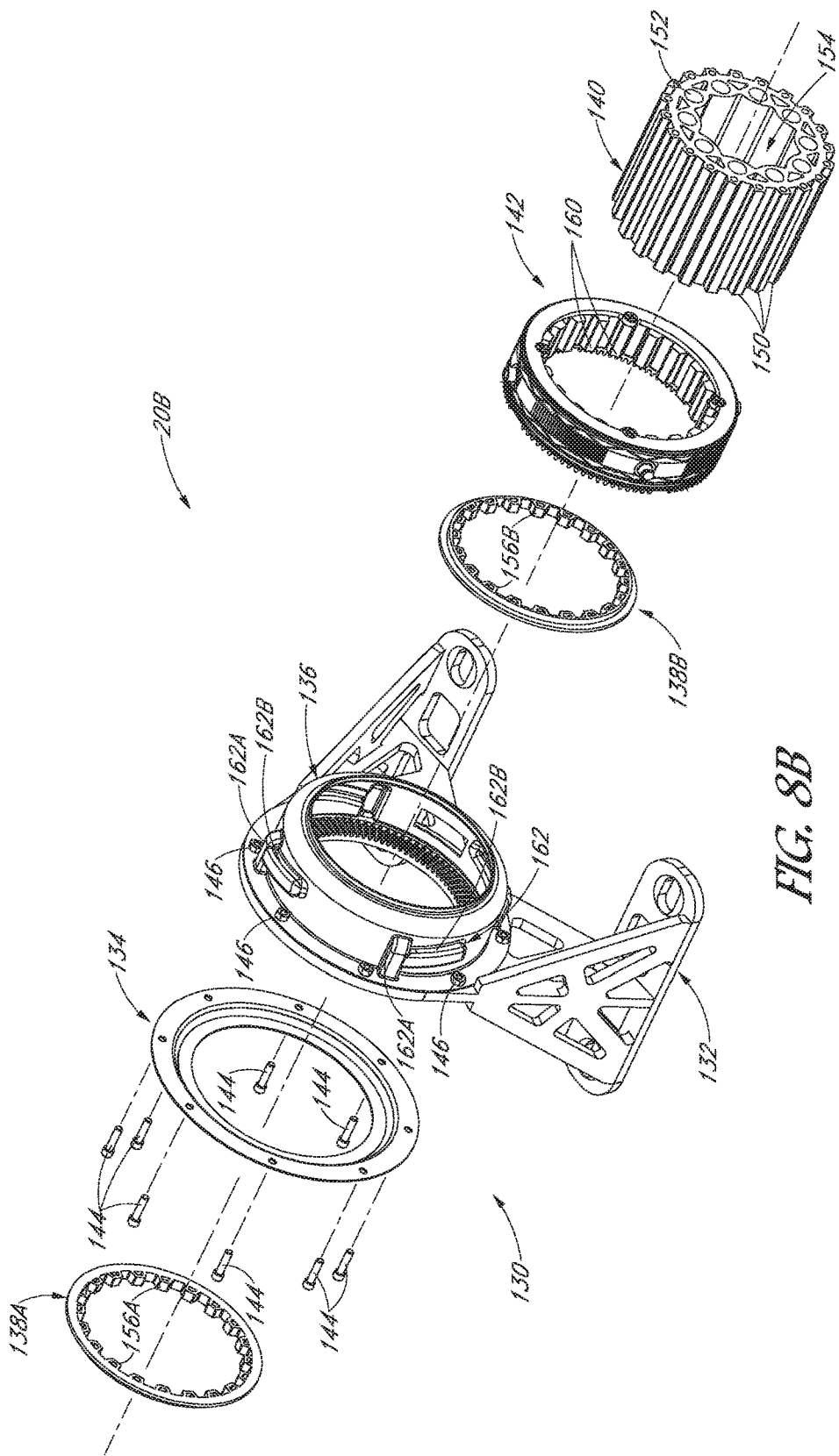
FIG. 8B is an exploded isometric view of the face spline torsion lock of FIG. 8A.

FIGS. 8A and 8B show lock 20B which, like lock 20A, makes use of a face spline locking mechanism. FIG. 8A is an isometric assembled view of lock 20B, and FIG. 8B is an isometric exploded view of lock 20B. FIGS. 8A and 8B will be discussed together.

Lock 20B includes housing assembly 130 (formed by housing 132, housing end cap 134, and housing cover 136), axle bearings 138A and 138B, axle 140 and slider assembly 142. Also shown in FIGS. 8A and 8B are bolts 144 and nuts 146, which are used to fasten together housing 132 and housing end cap 134 and housing cover 136.

Axle 140 includes axially extending external splines 150 on its outer surface that are circumferentially spaced around the periphery of axle 140. Axle 140 also includes mounting holes 152 and center passage 154. Axle bearings 138A and 138B include splines 156A and 156B, respectively. Internal splines 156A and 156B mate with external splines 150 of axle 140 so that axle bearings 138A and 138B can mount on opposite ends of axle 140. Slider assembly 142 includes internal splines 160 on its inner surface which also mate with external splines 150 of axle 140. When lock 20B is assembled, slider assembly 142 is positioned on axle 140 with splines 160 engaging splines 150 of axle 140. Slider assembly 142 is positioned on axle 140 between axle bearing 138A at one end and axle bearing 138B at the other end of axle 140. When assembled, axle bearing 138A engages housing end cap 134, and axle bearing 138B engages housing cover 136.

As seen in FIGS. 8A and 8B, housing cover 136 includes four T-shaped guide tracks 162, which provide a ramping function to guide axial movement of slider assembly 142, between locked and unlocked positions. Each guide track 162 includes axial portion 162A and angled ramp portion 162B. Guide tracks 162 will be discussed further in conjunction with FIGS. 11A-11B.

Figure 9:
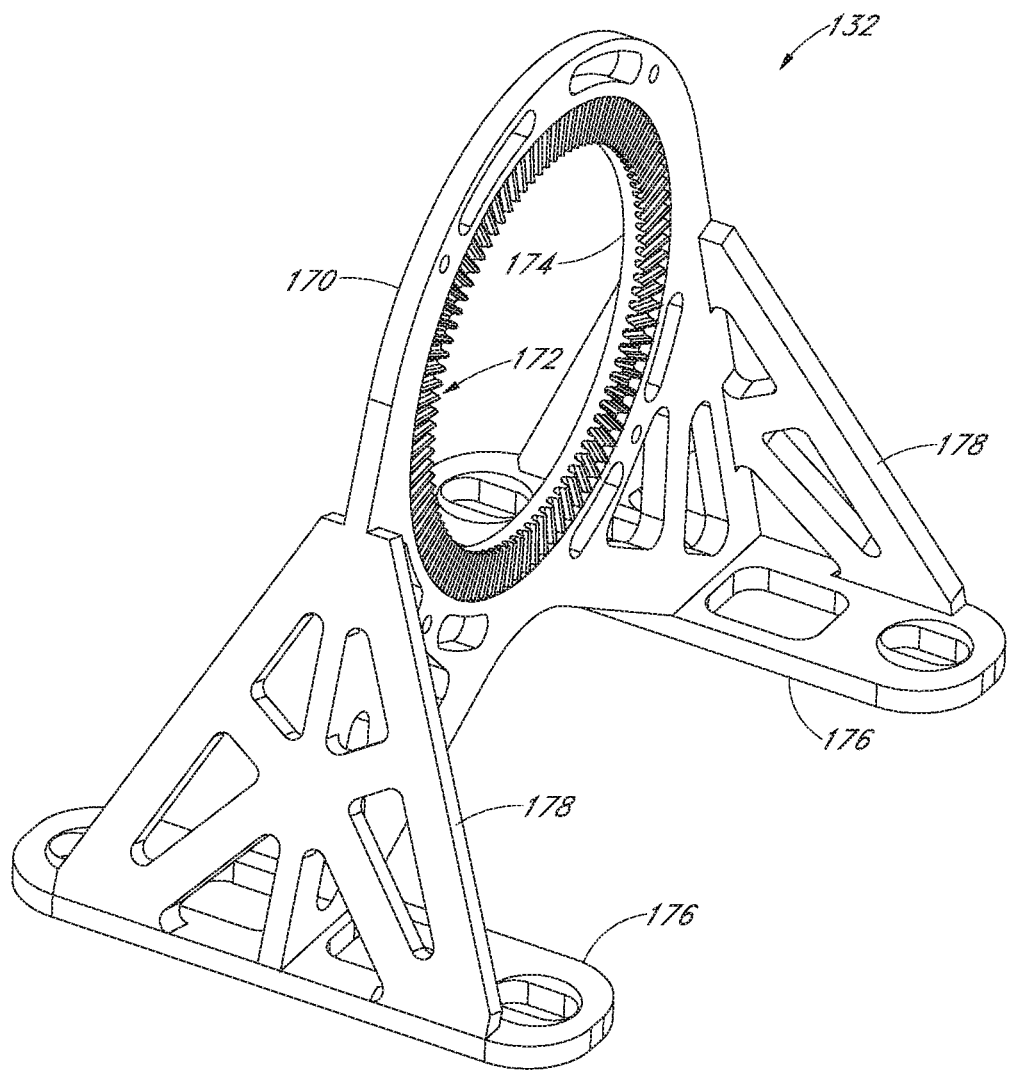
FIG. 9 is an isometric view of the housing of the face spline torsion lock of FIG. 8A-8B.

FIG. 9 shows an isometric view of housing 132 with housing end cap 134 and housing cover 136 removed. As shown in FIG. 9, housing 132 includes main housing plate 170 with built in radial face splines 172 surrounding central opening 174, base 176, and side supports 178.

Figure 10A:
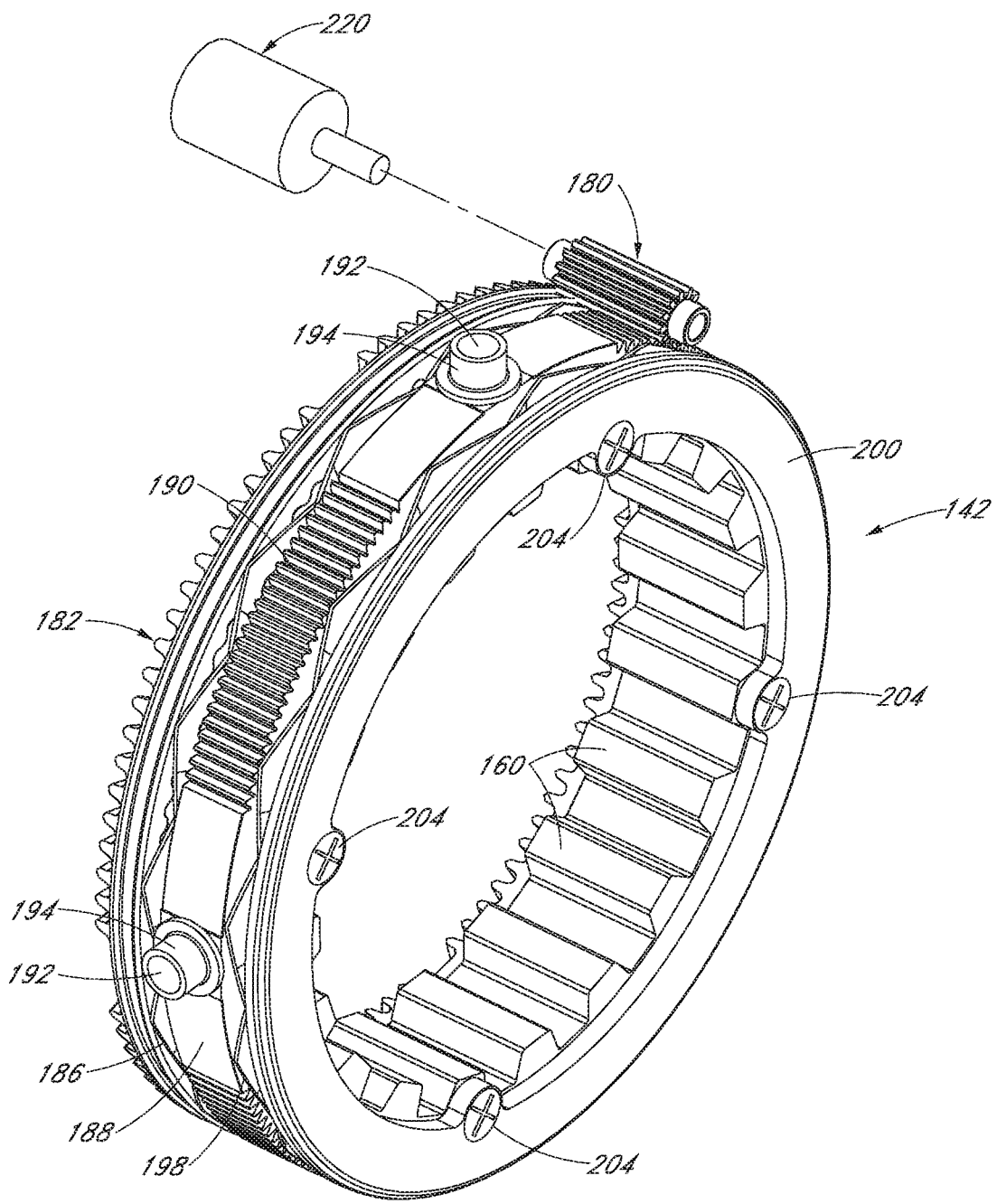
FIG. 10A is an assembled isometric view of a slider and pinion gear of the face spline torsion lock of FIG. 8A-8C.
Figure 10B:
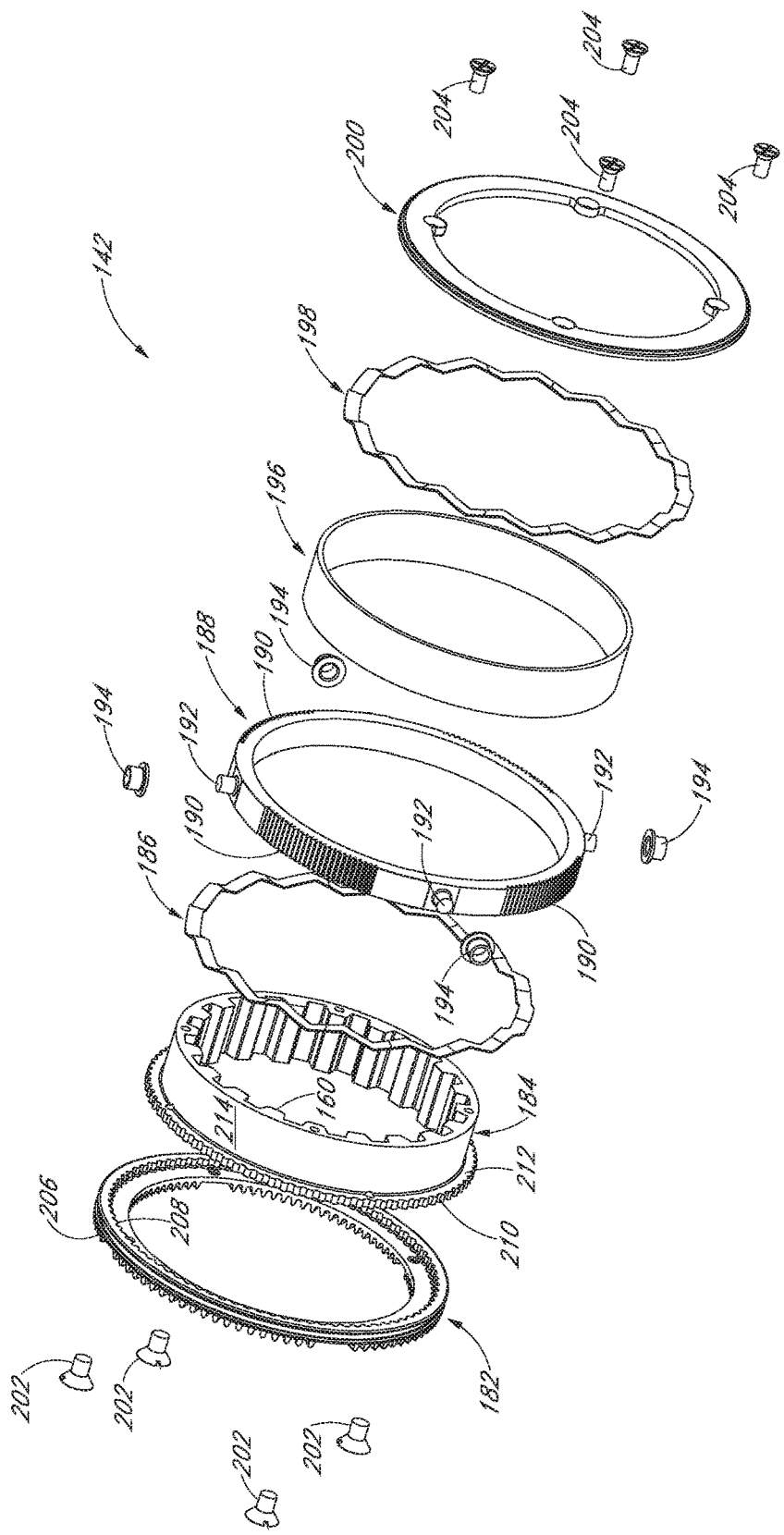
FIG. 10B is an exploded view of the slider assembly of FIG. 10A.

FIGS. 10A and 10B show slider assembly 142 in greater detail. FIG. 10A is an assembled isometric view of slider assembly 140 together with pinion gear 180. FIG. 10B is an exploded isometric view of slider assembly 142. FIGS. 10A and 10B will be discussed together. Slider assembly 142 includes slider face spline plate 182, slider 184, collar spring 186, collar 188 with gear segment splines 190, collar guides 192, collar guide bearings 194, slider bearing 196, collar spring 198, slider end plate 200, screws 202, and screws 204.

Slider face spline plate 182 has radially extending face splines 206 that face radial face splines 172 of housing 170 when slider assembly 142 is positioned on axle 140 within housing assembly 130. Slider face spline plate 182 also has a set of internal axial mounting splines 208 that mate with external mounting splines 210 on slider flange 212 of slider 184. Screws 202 hold together slider face spline plate 182 and slider flange 212 in the axial direction. Splines 208 and 210 prevent relative rotation of slider face spline plate 182 and slider flange 212.

Slider bearing 196 is positioned on cylindrical outer surface of slider body 214 of slider 184. Collar spring 186, one collar 188, and collar spring 198 are positioned on slider bearing 196 when slider assembly 142 is assembled. Slider end cap 200 is attached to slider 184 by screws 204. When assembled, slider assembly 142 has collar 188 positioned between collar springs 186 and 198. Collar spring 186 is between slider flange 212 and collar 186, and collar spring 198 is between collar 188 and slider end cap 200.

Pinion gear 180 is used to rotate collar 188 relative to slider 184 and thereby cause axial movement of slider 184 and slider face spline plate with respect to axle 140. As pinion gear 120 is driven by servomotor 220, collar 188 is driven in either a clockwise or a counterclockwise direction.

Figure 11B:
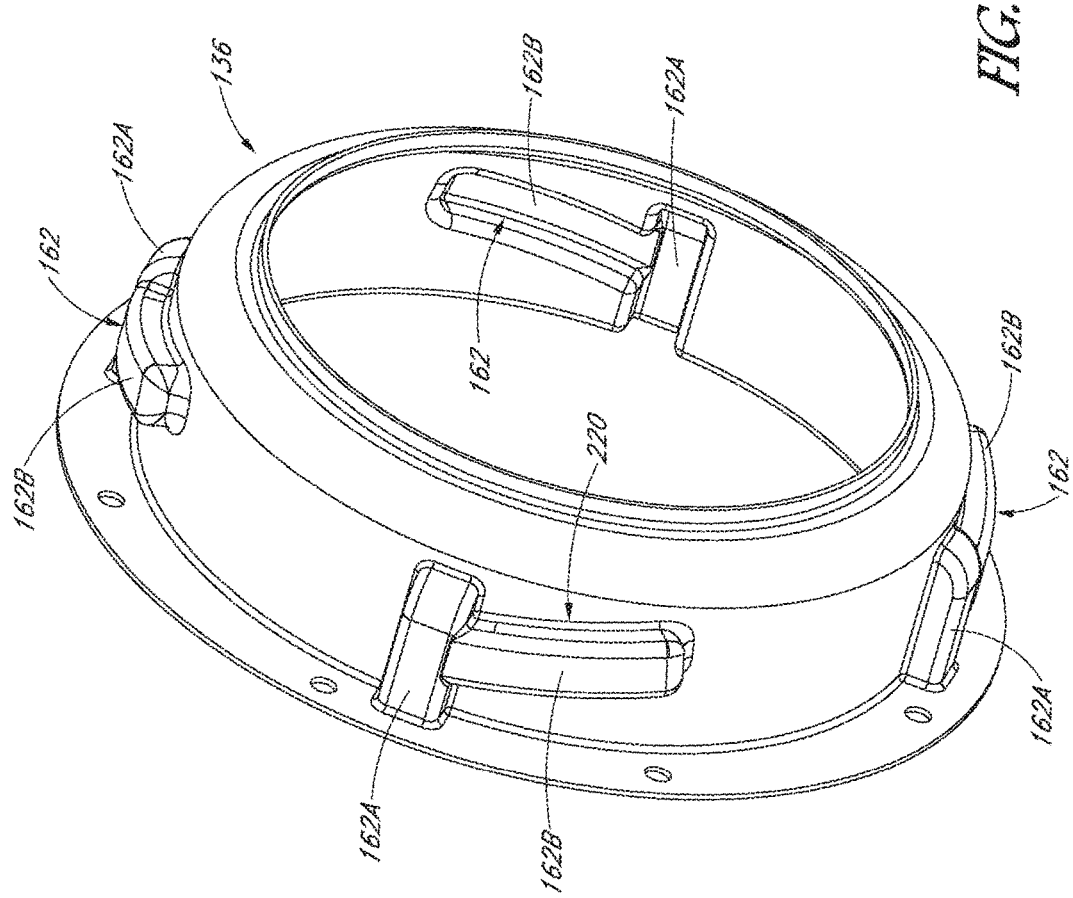
FIG. 11B is an isometric view of the housing cover of the face spline torsion lock of FIG. 8A.

As collar 188 is rotated, collar guides 192 with collar guide bearings 194 travel in guide tracks 162 of housing cover 136, as shown in FIGS. 11A and 11B. FIG. 11A is an enlarged view of lock 20B with housing cover 136 in phantom. FIG. 11B is an isometric view of housing cover 136 showing guide tracks 162.

Guide tracks 162 include axial portion 162A and angled ramp portion 162B. Axial portion 162A is used when lock 20B is being assembled and disassembled, and in particular when housing cover 136 is mounted onto or removed from housing 132. Guide track angled ramp portions 162B are connected at one end to axial track portions 162A. As collar 188 is rotated, collar guides 192 and collar guide bearings 194 will travel in guide track ramp portions 162B which are oriented with both an axial and a circumferential component.

As viewed from the direction illustrated in FIGS. 10A, 10B, and 11, rotation of collar 188 in a counterclockwise direction will cause slider assembly 142 and slider face spline plate 182 to move away from radial face splines 172 of housing 132. Rotation in the clockwise direction will drive slider assembly 142 and slider face spline plate 182 toward face splines 172 of housing 132. Thus, servomotor 220 and pinion gear 180 drive collar 188 in a clockwise direction in order to bring splines 172 and 206 into engagement in a locked state, and drive collar 188 in a counterclockwise direction to move face splines 206 out of engagement with face splines 172 to place lock 20B in an unlocked state.

Figure 12A:
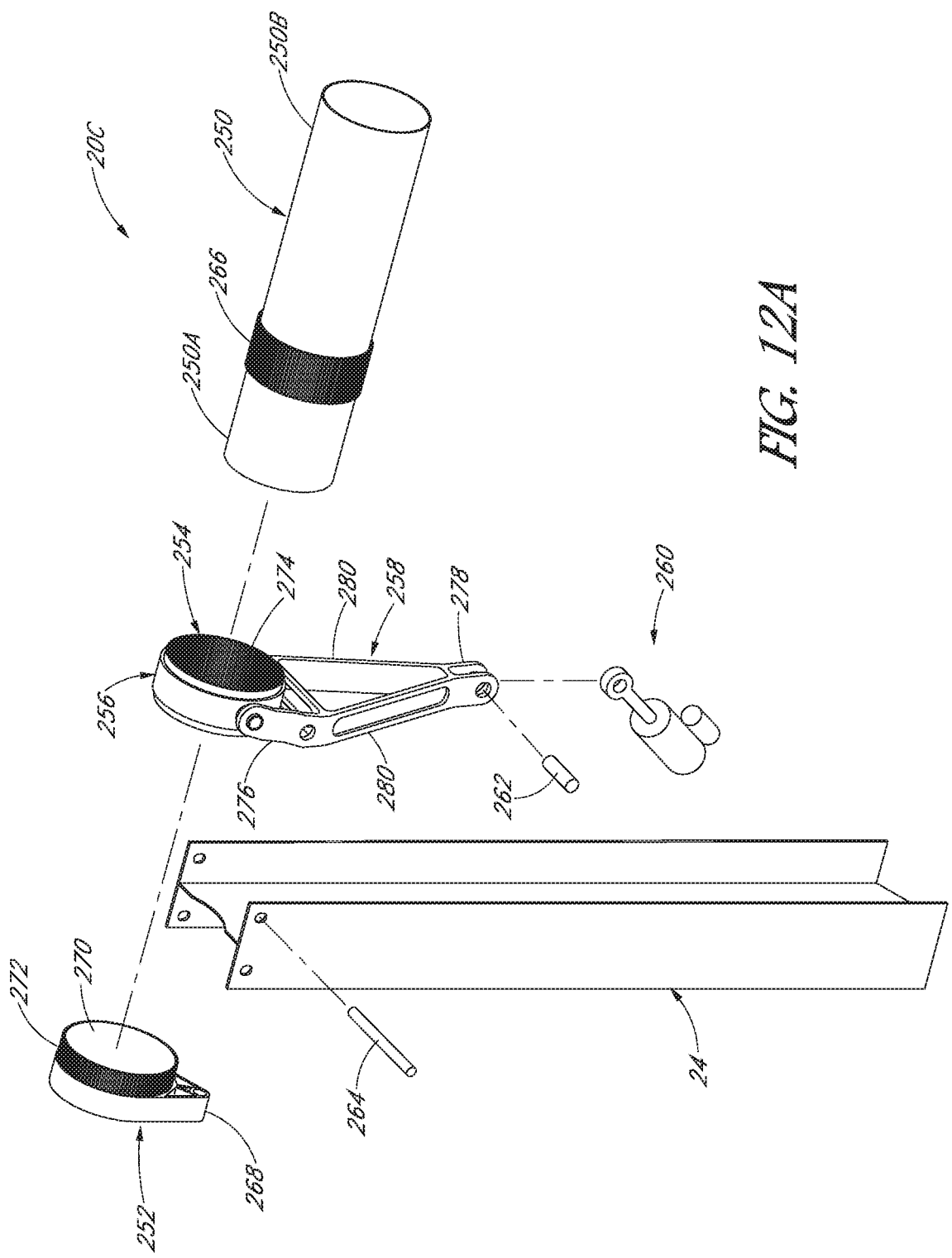
FIG. 12A is an exploded isometric view of a splined collar torsion lock.
Figure 12B:
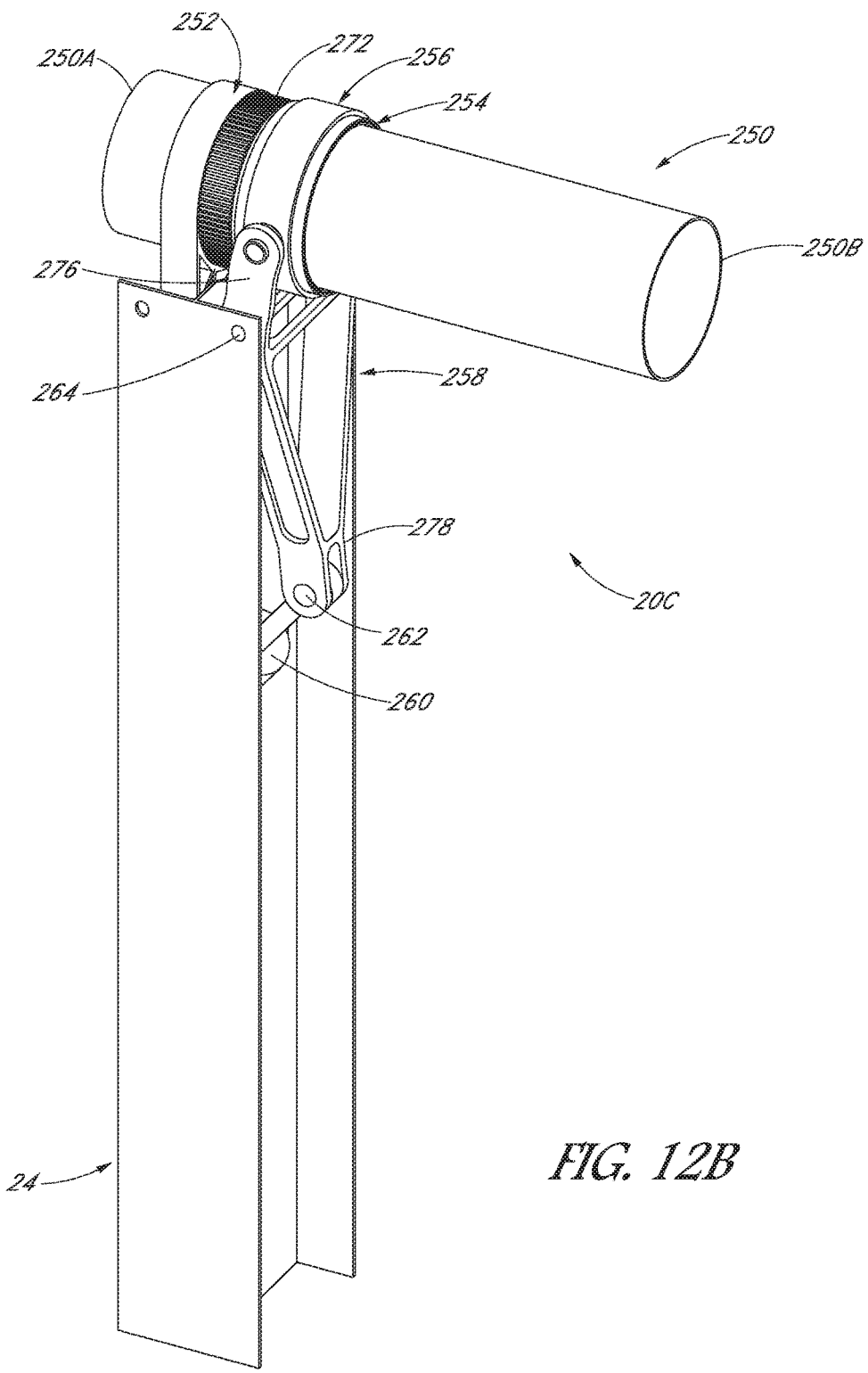
FIG. 12B is an assembled isometric view of a splined collar torsion lock in an unlocked state.
Figure 12C:
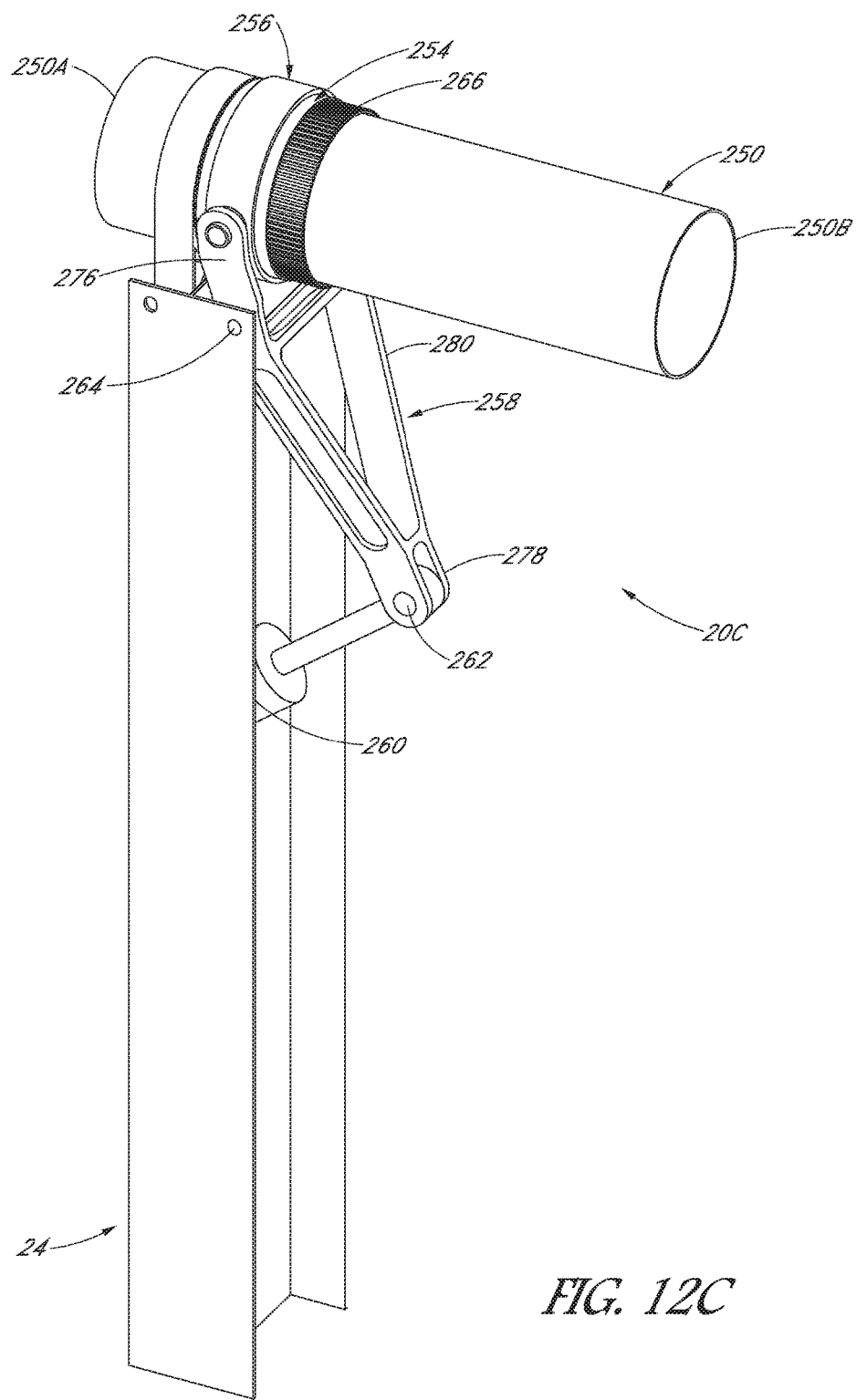
FIG. 12C is an assembled isometric view of a splined collar torsion lock in a locked state.

Splined Collar Torsion Lock 20C (FIGS. 12A-12C)

FIGS. 12A-12C show lock 20C, which uses a splined collar locking mechanism. FIG. 12A is an exploded isometric view of lock 20C. FIGS. 12B and 12C are assembled isometric views of lock 20C in an unlocked state and locked state, respectively. FIGS. 12A-12C will be discussed together.

Lock 20C is mounted and an upper end of pile 24, and includes torque tube section (or axle) 250, housing 252, collar 254, sleeve 256, actuation arm 258, actuator 260, and pivotal connectors to 262 and 264.

Torque tube section (or axle) 250 includes splines 266 on its outer surface. Splines 266 are axially oriented and circumferentially separated. Splines 266 rotate with torque tube section 250 as torque tube section 250 is rotated to adjust position of solar collection modules.

Housing 252 includes frame 268, bearing 270, and axial splines 272. Collar 254 is a tubular segment having axial splines 274 on its inner surface. Splines 274 mate with both splines 266 on torque tube section 250 and splines 272 on the outer surface of bearing 270.

Sleeve 256 surrounds collar 254. Sleeve 256 allows collar 254 to rotate with respect to sleeve 256, and engages collar 254 to apply axial force to move collar 254 between an unlocked position and a locked position.

Actuation arm 258 includes yoke 276 at its upper end, clevis 278 at its lower end, and a pair of arms 280 extending between clevis 278 and yoke 276. Yoke 276 is pivotally connected to sleeve 256.

Actuator 260 can be a linear actuator similar to linear actuator 34 shown in FIG. 2A. It is a slewing actuator that can move between two positions and can hold either position without requiring continued application of power.

Lock 20C is mounted on pile 24, with housing 252 attached to the upper end of pile 24. Actuation arm 258 is pivotally connected to the upper end of pile 24 by connector 264 and is pivotally connected at clevis 278 to the upper end of actuator 260 by connector 262. The lower end of actuator 260 can be pivotally mounted to pile 24 by a mounting bracket (not shown).

Torque tube section 250 extends through collar 254 and through housing 252, so that end 250A of torque tube section 250 extends beyond housing 252. End 250B of torque tube section 250 extends in an opposite direction beyond collar 254.

FIG. 12B shows lock 20C in the unlocked state. Collar 254 is positioned over splines 266, and is spaced from splines 272 of housing 252. In this position, torque tube 250 can rotate with respect to housing 252, and collar 254 can rotate freely with respect to sleeve 256.

FIG. 12C shows lock 20C in the locked state. Actuator 260 has extended so that clevis 278 at the lower and of actuation arm 258 has moved away from pile 24, and yoke at the upper end of actuation arm 258 has moved toward housing 252. In FIG. 12C, collar 254 is positioned so that internal splines 274 of collar 254 still engage a portion of external splines 266 of torque tube section 250, but also engage external splines 272 of housing 250. In this engaged position, collar 254 locks together splines 266 and 272, so as to inhibit rotation of torque tube section 250.

To return lock 250 to the unlocked position, actuator 260 retracts, pulling clevis 278 toward pile 24. Sleeve 256 moves along with yoke 276 away from housing 252. The movement of sleeve 256 in an axial direction away from housing 252 moves collar 254 to disengage splines 272, and to move further over splines 266 on torque tube section 250.

Ruffle Row Torsion Lock 20D (FIGS. 13A-15B)

Figure 13B:
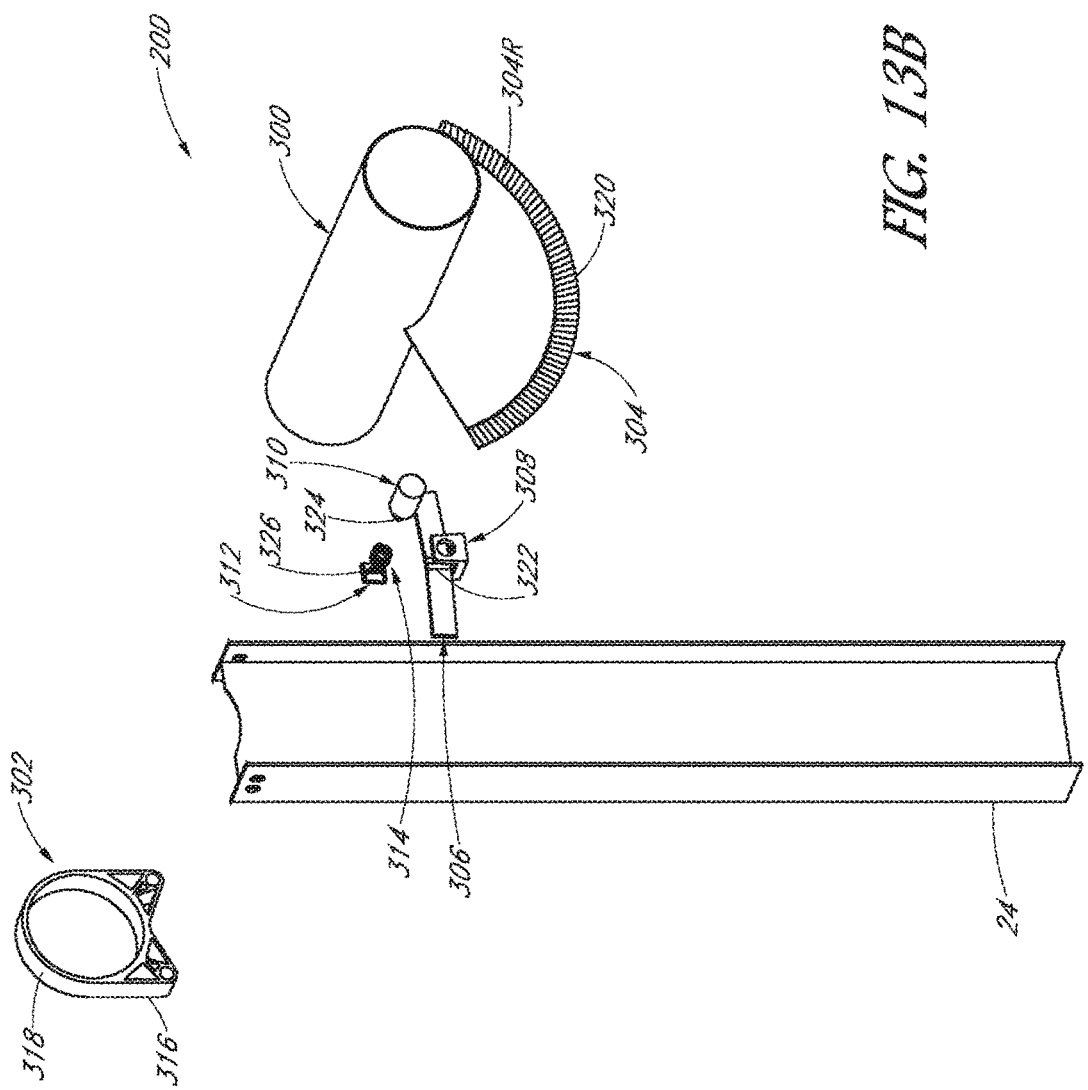
FIG. 13B is an exploded isometric view of the ruffle row torsion lock.

FIGS. 13A and 13B show lock 20D, which utilizes a ruffle row locking mechanism. FIG. 13A is an assembled isometric view of lock 20D mounted at an upper end of pile 24. FIG. 13B is an exploded isometric view showing lock 20D and pile 24. FIGS. 13A and 13B will be discussed together.

Lock 20D shown in FIGS. 13A and 13B includes torque tube section (or axle) 300, housing 302, fan shaped disc segment 304, pressure backplate 306, solenoid mount 308, solenoid 310, clamp plate 312, and spring 314.

Torque tube section 300 extends through housing 302, which is mounted at the upper end of pile 24. Housing 302 includes frame section 316 and bearing section 318. Torque tube section 300 is rotatable in housing 302.

Fan shaped disc segment 304 is attached to and rotatable with torque tube section 300. Disc segment 304 includes circumferentially spaced radial splines or ruffles 320 at outer peripheral region 304R.

Pressure backplate 306 is attached to pile 24. Pressure backplate 306 includes splines 322, which mate with splines 320 of disc segment 304. Solenoid mount 308 is attached to pressure plate 306, and solenoid 310 is mounted to solenoid mount 308. Plunger 324 of solenoid 310 is connected to clamp plate 312. Spring 314 is mounted between clamp plate 312 and solenoid 310, and biases clamp plate 312 toward pressure backplate 306. Splines 326 on clamp plate 312 face toward splines 322 of pressure backplate 306. Disc segment 304 is positioned between backplate 306 and clamp plate 312, as shown in the FIG. 13A.

In normal operation, solenoid 310 is de-energized, and lock 20D is in the locked state. Spring 314 applies clamping force to clamp plate 312 so that disc segment 304 is clamped between clamp plate 312 and pressure backplate 304. Splines 322 of pressure backplate 306 and splines 326 of clamp plate 312 engage splines 320 of disc segment 304. In the locked state, torque tube 300 is clamped or locked in position. The spline feature angles of splines 320, 322, and 326 are such that the clamping, frictional, and normal forces acting on the mating splines cancels any row torque that would tend to disengage the splines from one another.

Figure 14A:
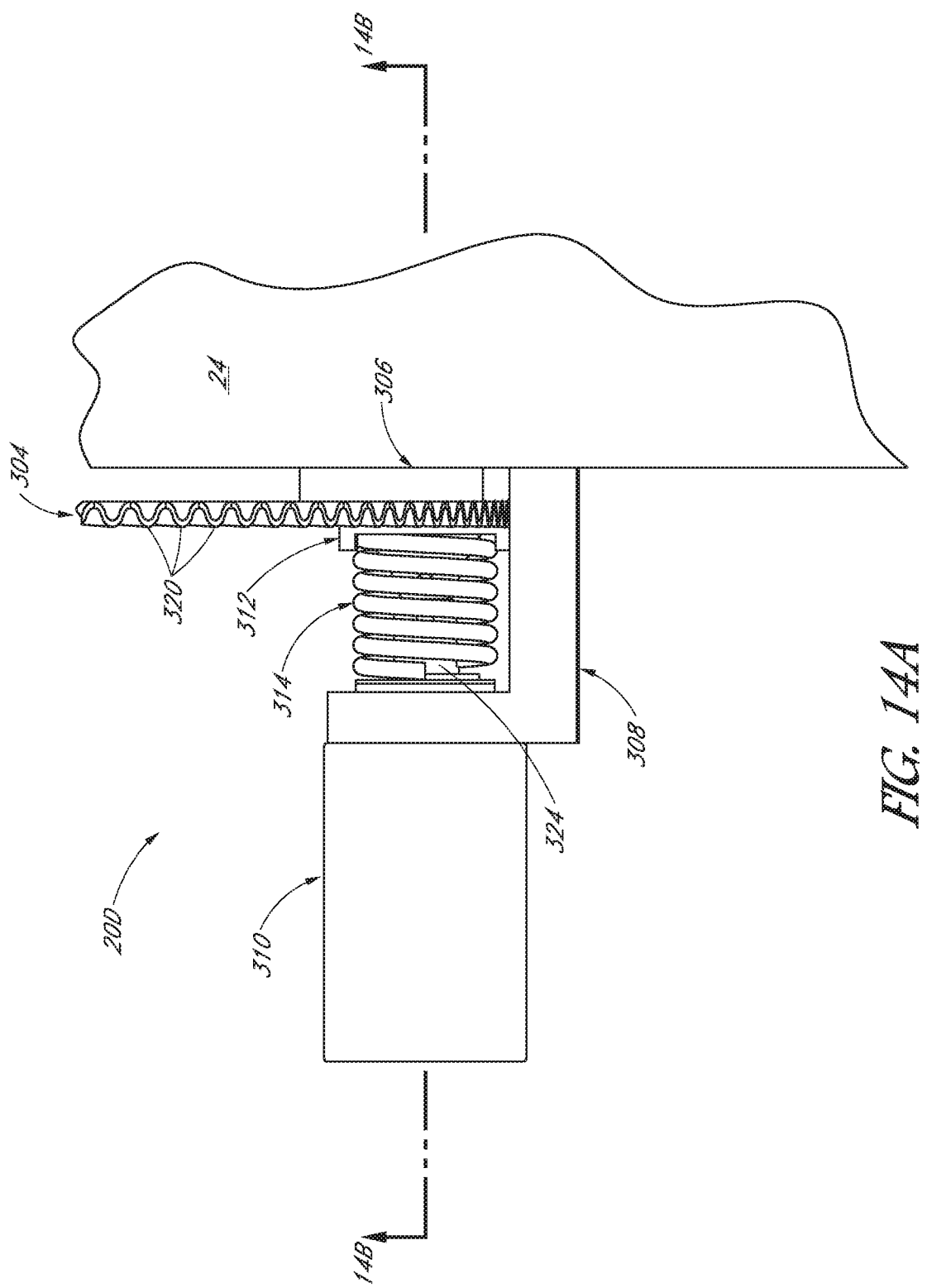

FIGS. 14A and 14B show the side and sectional views, respectively, of a portion of lock 20D in a locked state. Solenoid 310 is de-energized and clamp plate is 312 applying a clamping force to hold splines 320 of disc segment 304 between clamp plate 312 and pressure backplate 306. The clamping force is provided by spring 314. In the locked state shown in FIGS. 14A and 14B, disc segment 304 and torque tube section 300 are inhibited from rotation by the clamping force applied by spring 314 to clamp plate 312. As shown in FIG. 14B, when lock 20D is in the locked state, the clamping force applied through clamp plate 312 slightly bends disc segment 304, forcing it into splines 322 of pressure backplate 306.

To allow rotation of torque tube section 300, solenoid 310 is energized. When energized, solenoid 310 retracts plunger 324 and causes clamp plate 312 to retract away from disc segment 304. When solenoid 310 is energized, disc segment 304 is released and torque tube section 300 can rotate.

FIGS. 15A and 15B are side and sectional views, respectively, showing clamp plate 312 retracted from disc segment 304 and pressure backplate 306. In this unlocked state, torque tube segment 300 and disc segment 304 can rotate about the axis of torque tube 300. The unlocked state continues only for the period during which solenoid 310 is energized. Once rotation of torque tube section has been completed, solenoid 310 is de-energized, and lock 20D returns to the locked state. This minimizes the total energy required to operate lock 20D.

Falling Pins Torsion Lock 20E (FIGS. 16A-17B)

Figure 16A:
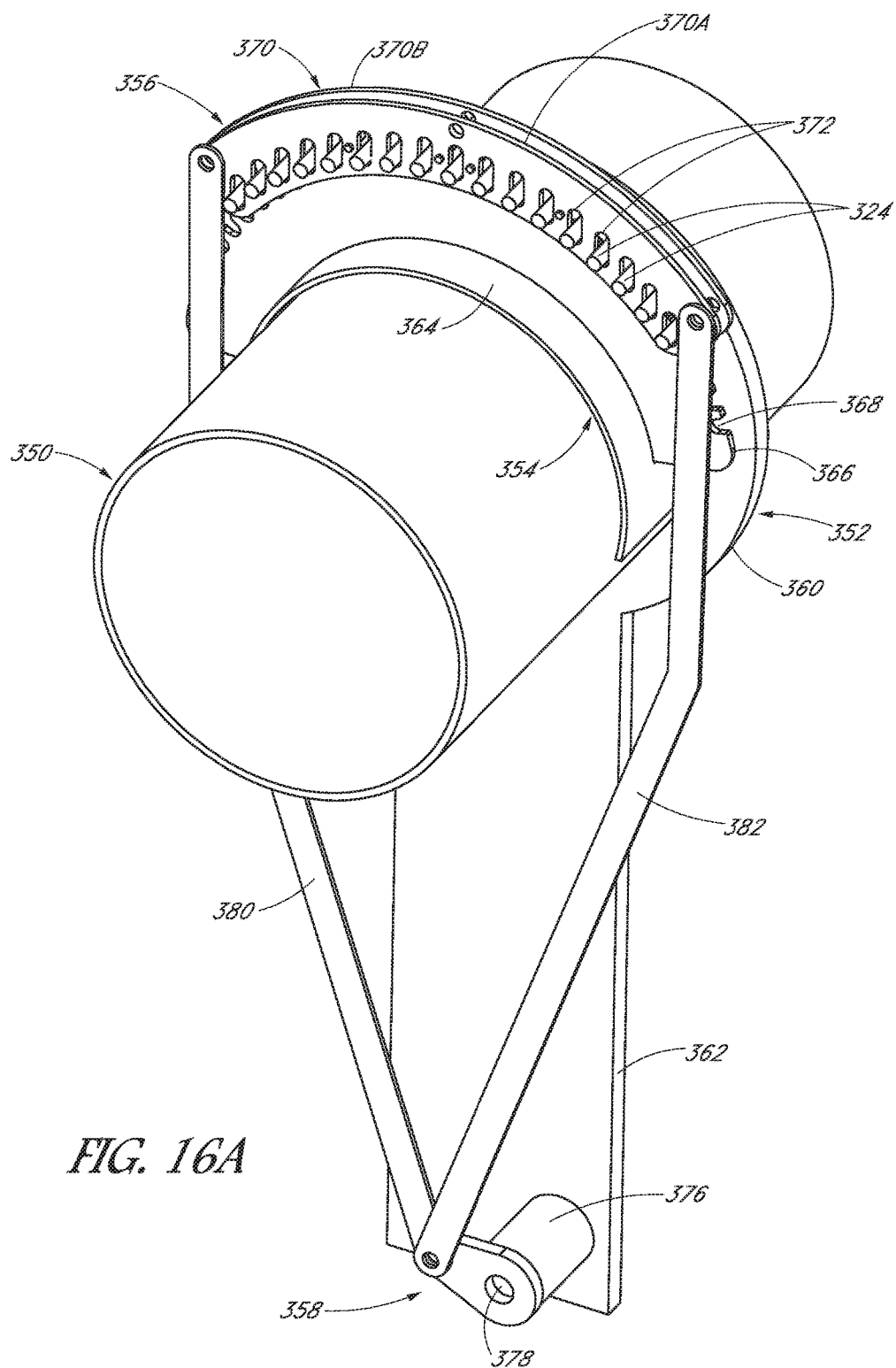
FIG. 16A is an assembled isometric view of a falling pins torsion lock.

Lock 20E shown in FIGS. 16A and 16B makes use of a falling pins locking mechanism. FIG. 16A is an assembled isometric view of lock 20E, and FIG. 16B is an exploded isometric view of lock 20E. FIGS. 16A and 16B will be discussed together.

Lock 20E includes torque tube section (or axle) 350, housing 352, sprocket 354, pin locking mechanism 356 and actuator mechanism 358. Housing 352 includes bearing section 360 and frame section 362. Sprocket 354, which is attached to torque tube section 350, includes sprocket base 364, arcuate sprocket plate 366, and sprocket teeth or splines 368. Pin locking mechanism 356 includes pin holder 370 formed by two spaced arcuate pin holder plates 370A and 370B that contain matching vertical slots 372 for holding pins 374. Plates 370A and 370B are spaced from one another so that they can be positioned on opposite sides of sprocket plate 366. Vertical slots 372 are spaced to match the openings between sprocket teeth 368. Pins 374 are carried in slots 372 of pin holder 370. The arc of pin holder 370 matches the arc of sprocket plate 366. Actuator mechanism 358 includes rotary actuator 376, crank arm 378, and scissor arms 380 and 382.

Frame 362 mounts to an upper end of pile 24 (not shown), so that bearing section 360 is located above the upper end of pile 24. Torque tube section 350 is inserted through bearing section 360 so that sprocket 354 is positioned adjacent to and in front of the front face of bearing section 360.

Rotary actuator 376 is mounted to frame 362, and can be, for example, a small servomotor. Crank arm 378 is connected to rotary actuator 376 so that crank arm 378 can be rotated by rotary actuator 376 between an unlocked position and a locked position. The lower ends of scissor arms 380 and 382 are attached to crank arm 378, and will move upward and downward depending upon rotation of crank arm 378. The upper ends of scissor arms 380 and 382 are connected to the outer ends of pin holder 370. Pin holder 370 is positioned so that plates 370A and 370B are on opposite sides of sprocket plate 366.

Figure 17A:
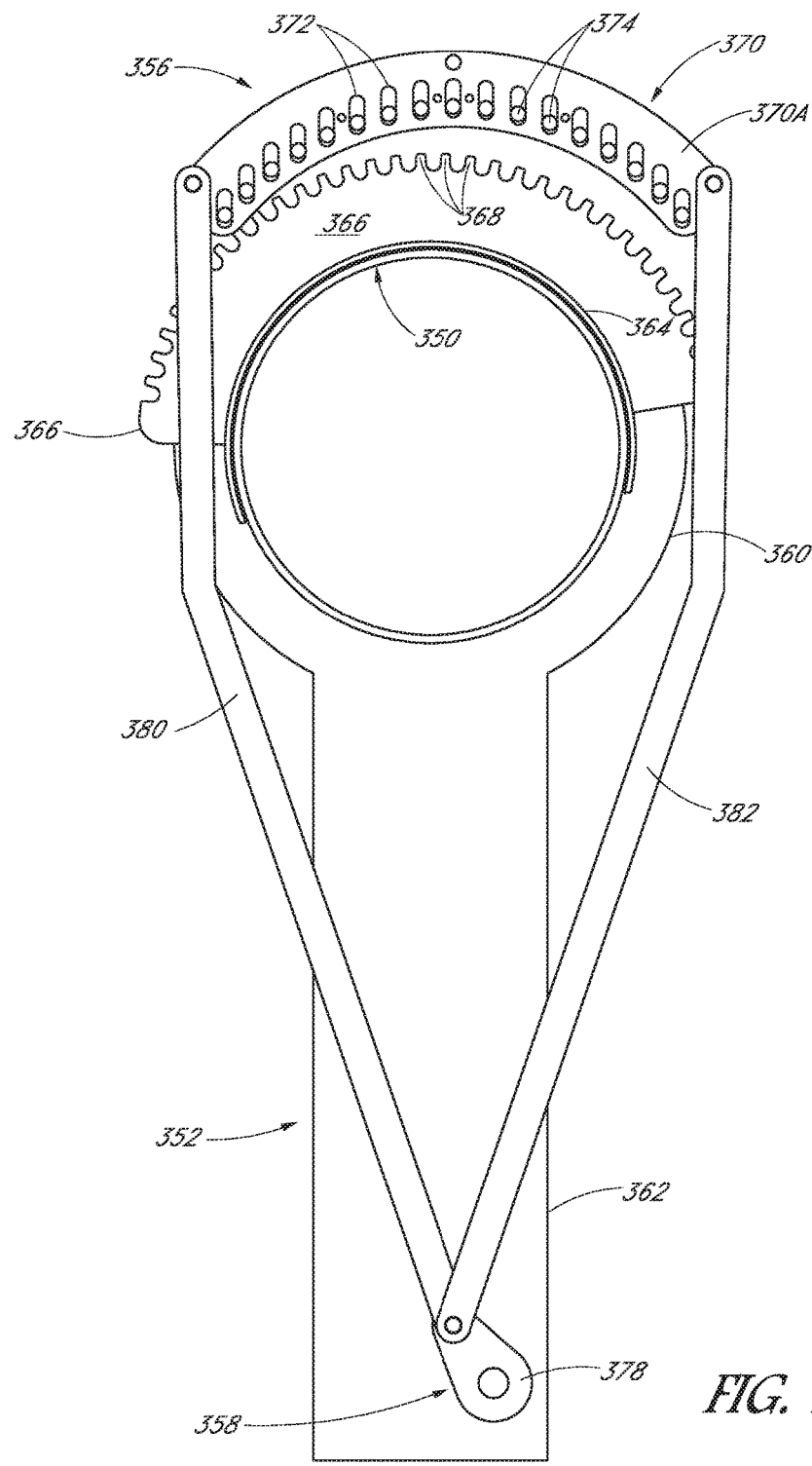
FIG. 17A is a front view of the falling pins torsion lock in an unlocked state.
Figure 17B:
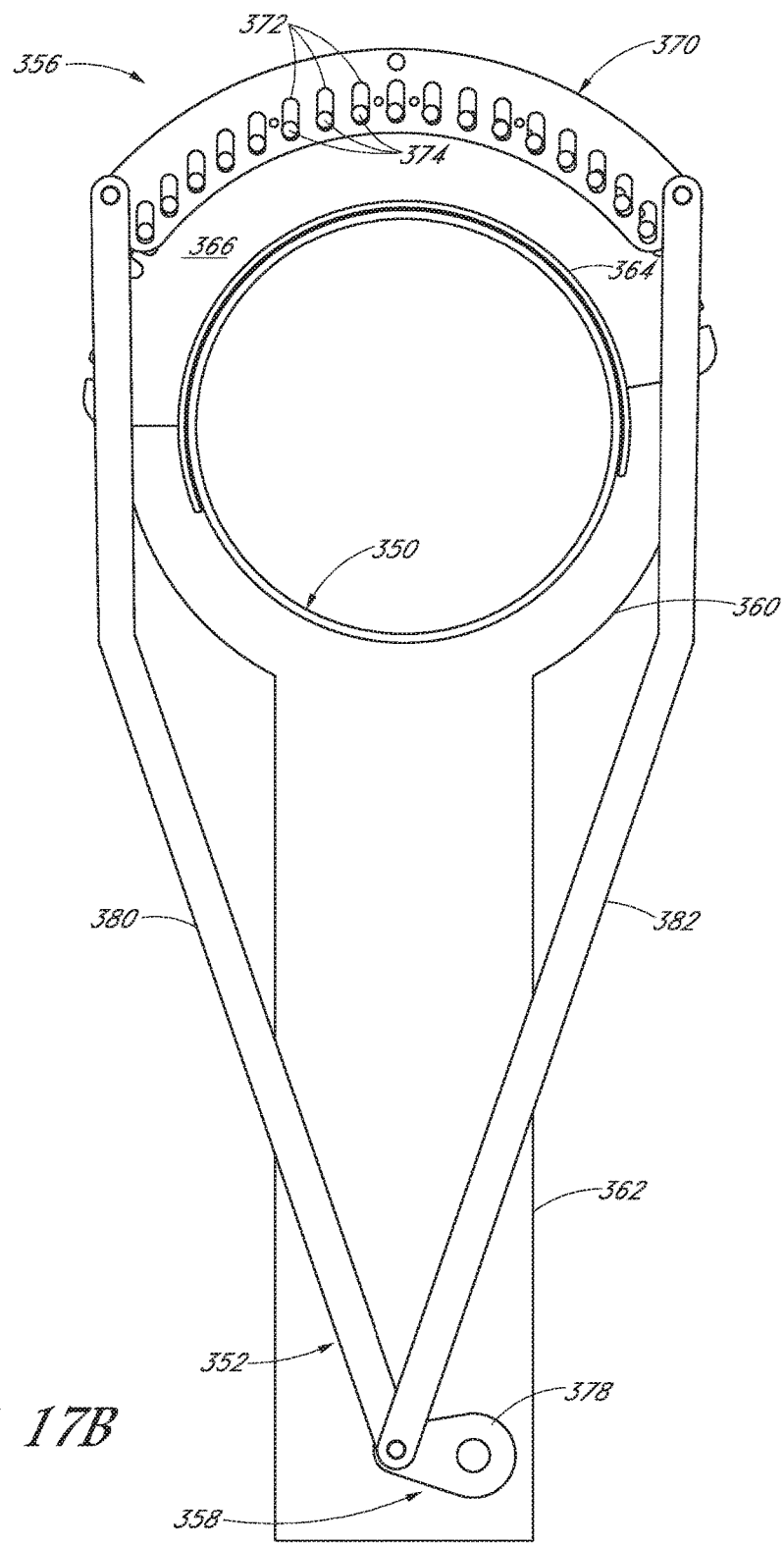
FIG. 17B is a front view of the falling pins torsion lock in a locked state.

The operation of lock 20 is illustrated by FIGS. 17A and 17B. FIG. 17A shows lock 20E in the unlocked state, and FIG. 17B shows lock 20E in the locked state.

In the unlocked state shown in FIG. 17A, rotary actuator 376 has rotated crank arm 378 so that the outer end of crank arm 378 that is attached to scissor arms 380 and 382 is in a raised position. As a result, scissor arms 380 and 382 have been moved upward so that pin holder 370 is elevated above sprocket 354. Pins 374 are shown at the lower end of their respective vertical slots 372, and are located above 368 of sprocket 354. In the unlocked state shown in FIG. 17A, pins 374 are elevated by pin holder 370 and actuator mechanism 358 so that pins 374 are out of engagement with sprocket 354. In the unlocked state, torque tube 350 is free to rotate in either a clockwise or a clock counterclockwise direction.

In the locked state shown in FIG. 17B, rotary actuator 376 has rotated crank arm 378 in a counterclockwise direction so that the outer end of crank arm 378 is in a lower position than shown in FIG. 17A. As a result, scissor arms 380 and 382 have been pulled downward, which in turn pulled downward pin holder 370. As a result, pins 374 have dropped into slots between sprocket teeth 368 of sprocket 354. With pins 374 position between sprocket teeth 368, rotation of sprocket 354 with respect to pin holder 370 is inhibited. In turn, rotation of torque tube section 350 is inhibited in the locked state.

Lock 20E can change from the locked state shown in FIG. 17B to the unlocked state shown in FIG. 17A by rotation of crank arm 378 in a clockwise direction. That clockwise rotation of crank arm 378 will cause scissor arms 380 and 382 to lift pin holder 370 so that pins 374 no longer in engagement with sprocket 354, and torque tube section 350 will be free to rotate.

Discussion of Possible Embodiments

The following are non-exclusive descriptions of possible embodiments of the present invention.

A sun tracking solar energy collection system includes a torque tube; first and second piles for supporting the torque tube at first and second spaced positions, respectively; a plurality of solar energy collecting devices connected to the torque tube; a drive mechanism mounted to the first pile and configured to rotate the torque tube; and a rotation locking device. The rotation locking device includes a housing, mounted to the second pile, through which the torque tube extends; a first locking member having a plurality of circumferentially spaced projections attached to and rotatable with the torque tube; a second locking member connected to the housing and having a plurality of mating elements for engaging the projections of the first locking member; and an actuator configured to relatively move the first and second locking members between an unlocked position in which the mating elements are disengaged from the projections, and a locked position in which the mating elements are engaged with the projections to inhibit rotation of the torque tube with respect to the housing.

The sun tracking solar energy collection system of the preceding paragraph can optionally include, additionally and/or alternatively, any one or more of the following features, configurations, operations and/or additional components:

The torque tube includes an axle that extends through the housing and is rotatable about an axis.

The rotation locking device further includes a slider assembly, mounted on the axle, which is rotatable with the axle and is axially movable with respect to the axle.

The first locking member includes a first spline plate mounted on the slider assembly and the projections comprise a first set of face splines facing the second locking member; and the second locking member includes a second spline plate mounted on the housing and the mating elements comprise a second set of face splines facing the slider assembly.

The actuator is coupled to the slider assembly and configured to move the slider between an unlocked position in which the first spline plate of the first locking member is spaced from the second spline plate of the second locking member and the first set of face splines of the first locking member and the second set of face splines of the second locking member are disengaged, and a locked position in which the first spline plate of the first locking member is in contact with the second spline plate of the second locking member and the first set of face splines of the first locking member and the second set of face splines of the second locking member are engaged to inhibit rotation of the axle with respect to the housing.

The axle includes a first set of axial splines on a radial outer surface, and the slider includes a second set of axial splines on a radial inner surface that mate with the first set of axial splines.

The slider assembly includes an annular body; a first end plate attached at a first end of the annular body; a second end plate attached at a second end of the annular body; a collar positioned on an outer surface of the annular body between the first end plate and the second end plate; a first wave spring positioned on the annular body between the collar and the first end plate; and a second wave spring positioned on the annular body between the collar and the second end plate.

The collar is rotatable with respect to the annular body of the slider.

The slider includes a set of radially outwardly projecting pins, and wherein the housing includes a set of tracks for receiving the pins, each track of the set of tracks defining a ramp that extends in both a circumferential and an axial direction.

The actuator is coupled to the collar of the slider to rotate the collar so that the pins follow the tracks to move the collar in a first axial direction when the collar is rotated in a first circumferential direction and to move the collar in a second axial direction when the collar is rotated in a second circumferential direction.

The collar includes a gear segment, and the actuator includes a pinion gear that engages the gear segment.

The collar includes a drive arm that extends outwardly from the collar, and the actuator includes a linear drive element connected to the drive arm.

The housing includes a base configured to mount on an upper end of a pile; and supports that connect the spline plate of the second locking member to the base.

The housing includes a housing end cap.

First and second axle bearings are mounted on the housing and positioned to support the axle.

The rotation locking device includes a bearing captured by the housing, the bearing having a smooth inner surface; and the torque tube extends through the bearing and is rotatable about an axis.

The first locking member comprises a first splined outer surface on the torque tube and a collar with an interior splined surface; the second locking member comprises a second splined outer surface on the bearing that is axially spaced for the first splined outer surface; and the actuator is coupled to the collar and configured to move the collar axially between an unlocked position in which the interior splined surface of the collar engages the first splined outer surface but not the second splined outer surface, and a locked position in which the interior splined surface of the collar engages both the first splined outer surface and the second outer splined surface to inhibit rotation of the torque tube with respect to the housing.

The torque tube extends through the housing and is rotatable about an axis; the first locking member comprises a ruffle disc attached to an rotatable with the torque tube, the ruffle disc having a plurality of circumferentially spaced face splines arranged in an arc with respect to the axis; the second locking member comprises face splines configured to mate with face splines of the ruffle disc; and the actuator is configured to move the second locking member axially between an unlocked position in which the face splines of the second locking member are disengaged form the face splines of the ruffle disc, and a locked position in which the face splines of the second locking member are engaged with the face splines of the ruffle disc to inhibit rotation of the torque tube with respect to the housing.

The torque tube extends through the housing and is rotatable about an axis; the first locking member comprises a sprocket rigidly attached to an outer surface of the torque tube; the second locking member is mounted on the housing and has a plurality of arcuately spaced pins carried in spaced slots; and the actuator is configured to move the second locking member between an unlocked position in which the pins of the second locking member are disengaged from teeth of the sprocket, and a locked position in which the pins of the second locking member are engaged with teeth of the sprocket to inhibit rotation of the sprocket and the torque tube with respect to the housing.

A rotation locking device includes a housing; an axle that extends through the housing and is rotatable about an axis: a first locking member having a plurality of circumferentially spaced projections attached to and rotatable with the axle; a second locking member connected to the housing and having a plurality of mating elements for engaging the projections of the first locking member; and an actuator configured to relatively move the first and second locking members between an unlocked position in which the mating elements are disengaged from the projections, and a locked position in which the mating elements are engaged with the projections to inhibit rotation of the axle with respect to the housing.

The rotation locking device of the preceding paragraph can optionally include, additionally and/or alternatively, any one or more of the following features, configurations, operations and/or additional components:

The rotation locking device includes a slider assembly, mounted on the axle and is rotatable with the axle and is axially movable with respect to the axle.

The first locking member includes a first spline plate mounted on the slider assembly and the projections comprise a first set of face splines facing the second locking member; the second locking member includes a second spline plate mounted on the housing and the mating elements comprise a second set of face splines facing the slider assembly; and the actuator is coupled to the slider assembly and configured to move the slider between an unlocked position in which the first spline plate of the first locking member is spaced from the second spline plate of the second locking member and the first set of face splines of the first locking member and the second set of face splines of the second locking member are disengaged, and a locked position in which the first spline plate of the first locking member is in contact with the second spline plate of the second locking member and the first set of face splines of the first locking member and the second set of face splines of the second locking member are engaged to inhibit rotation of the axle with respect to the housing.

The axle includes a first set of axial splines on a radial outer surface, and the slider assembly includes a second set of axial splines on a radial inner surface that mate with the first set of axial splines.

The slider assembly includes an annular body; a first end plate attached at a first end of the annular body; a second end plate attached at a second end of the annular body; a collar positioned on an outer surface of the annular body between the first end plate and the second end plate; a first wave spring positioned on the annular body between the collar and the first end plate; and a second wave spring positioned on the annular body between the collar and the second end plate.

The collar is rotatable with respect to the annular body of the slider assembly.

The slider assembly includes a set of radially outwardly projecting pins, and wherein the housing includes a set of tracks for receiving the pins, each track of the set of tracks defining a ramp that extends in both a circumferential and an axial direction.

The actuator is coupled to the collar of the slider assembly to rotate the collar so that the pins follow the tracks to move the collar in a first axial direction when the collar is rotated in a first circumferential direction and to move the collar in a second axial direction when the collar is rotated in a second circumferential direction.

The collar includes a gear segment, and the actuator includes a pinion gear that engages the gear segment.

The collar includes a drive arm that extends outwardly from the collar, and the actuator includes a linear drive element connected to the drive arm.

The housing includes a base configured to mount on an upper end of a pile; and supports that connect the spline plate of the second locking member to the base.

The housing includes a housing end cap.

First and second axle bearings are mounted on the housing and positioned to support the axle.

The first locking member comprises a first splined outer surface on the axle and a collar with an interior splined surface; the second locking member comprises a second splined outer surface on the housing that is axially spaced for the first splined outer surface; and the actuator is coupled to the collar and configured to move the collar axially between an unlocked position in which the interior splined surface of the collar engages the first splined outer surface but not the second splined outer surface, and a locked position in which the interior splined surface of the collar engages both the first splined outer surface and the second outer splined surface to inhibit rotation of the torque tube with respect to the housing.

The first locking member comprises a ruffle disk attached to an rotatable with the axle, the ruffle disc having a plurality of circumferentially spaced face splines arranged in an arc with respect to the axis; the second locking member comprises face splines configured to mate with face splines of the ruffle disc; and the actuator is configured to move the second locking member axially between an unlocked position in which the face splines of the second locking member are disengaged form the face splines of the ruffle disc, and a locked position in which the face splines of the second locking member are engaged with the face splines of the ruffle disc to inhibit rotation of the torque tube with respect to the housing.

The first locking member comprises a sprocket rigidly attached to an outer surface of the axle; the second locking member is mounted on the housing and has a plurality of spaced pins carried in spaced slots; and the actuator is configured to move the second locking member between an unlocked position in which the pins of the second locking member are disengaged from teeth of the sprocket, and a locked position in which the pins of the second locking member are engaged with teeth of the sprocket to inhibit rotation of the sprocket and the torque tube with respect to the housing.

A rotation locking device including a housing; an axle that extends through the housing and is rotatable about an axis; a slider assembly, mounted on the axle, that is rotatable with the axle and is axially movable with respect to the axle; a first spline plate mounted on the housing and having a first set of face splines facing the slider; a second spline plate mounted on the slider and having a second set of face splines facing the first spline plate; and an actuator coupled to the slider assembly and configured to move the slider assembly between an unlocked position in which the first spline plate is spaced from the second spline plate and the first set of face splines and the second set of face splines are disengaged and a locking position in which the first spline plate is in contact with the second spline plate and the first set of face splines and the second set of face splines are engaged to inhibit rotation of the axle with respect to the housing.

The rotation locking device of the preceding paragraph can optionally include, additionally and/or alternatively, any one or more of the following features, configurations, operations and/or additional components:

The axle includes a first set of axial spines on a radial outer surface, and the slider assembly includes a second set of axial splines on a radial inner surface that mate with the first set of axial splines.

The slider assembly includes an annular body; a first end plate attached at a first end of the annular body; a second end plate attached at a second end of the annular body; a collar positioned on an outer surface of the annular body between the first end plate and the second end plate; a first wave spring positioned on the annular body between the collar and the first end plate; and a second wave spring positioned on the annular body between the collar and the second end plate.

The collar is rotatable with respect to the annular body of the slider.

The slider assembly includes a set of radially outwardly projecting pins, and wherein the housing includes a set of tracks for receiving the pins, each track of the set of tracks defining a ramp that extends in both a circumferential and an axial direction.

The actuator is coupled to the collar of the slider assembly to rotate the collar so that the pins follow the tracks to move the collar in a first axial direction when the collar is rotated in a first circumferential direction and to move the collar in a second axial direction when the collar is rotated in a second circumferential direction.

The collar includes a gear segment, and wherein the actuator includes a pinion gear that engages the gear segment.

The collar includes a drive arm that extends outwardly from the collar, and the actuator includes a linear drive element connected to the drive arm.

The housing includes a base configured to mount on an upper end of a pile; and supports connect first spline plate to the base.

The housing includes a housing end cap.

First and second axle bearings are mounted on the housing and positioned to support the axle.

A rotation locking device includes a housing cap; a plastic bearing captured by the housing, the plastic bearing having a smooth inner surface and a first splined outer surface; a torque tube that extends through the plastic bearing and is rotatable about an axis; a second splined outer surface on the torque tube and axially spaced from the first splined outer surface; a collar with an interior splined surface; an actuator coupled to the collar and configured to move the collar axially between an unlocked positioned in which the interior splined surface of the collar engages the second splined outer surface but not the first splined outer surface, and a locked position in which the interior splined surface of the collar engages both the first splined outer surface and the second outer splined surface to inhibit rotation of the torque tube with respect to the housing.

A rotation locking device includes a housing; a torque tube that extends through the housing and is rotatable about an axis; a ruffle disc attached to and rotatable with the torque tube, the ruffle disc having a plurality of circumferentially spaced faced splines arranged in an arc with respect to the axis; a locking element having face splines configured to mate with face splines of the ruffle disc; an actuator configured to move the locking element axially between an unlocked position in which the face splines of the locking element are disengaged form the face splines of the ruffle disc, and a locked position in which the face splines of the locking element are engaged with the face splines of the ruffle disc to inhibit rotation of the torque tube with respect to the housing.

A rotation locking device including a housing; a torque tube that extends through the housing and is rotatable about an axis; a sprocket rigidly attached to an outer surface of the torque tube; a locking mechanism mounted on the housing and having a plurality of arcuately spaced pins carried in spaced slots; an actuator coupled to the locking mechanism and configured to move the locking mechanism between an unlocked position in which the pins of the locking mechanism are disengaged from teeth of the sprocket, and a locked position in which the pins of the locking mechanism are engaged with the teeth of the sprocket to inhibit rotation of the sprocket and the torque tube with respect to the housing.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A sun tracking solar energy collection system comprising:
   a torque tube;
   first and second piles for supporting the torque tube at first and second spaced positions, respectively;
   a plurality of solar energy collecting devices connected to the torque tube;
   a drive mechanism mounted to the first pile and configured to rotate the torque tube;
   a rotation locking device including:
      a housing, mounted to the second pile, through which the torque tube extends;
      a first locking member having a plurality of circumferentially spaced projections attached to and rotatable with the torque tube;
      a second locking member connected to the housing and having a plurality of mating elements for engaging the projections of the first locking member; and
      an actuator configured to relatively move the first and second locking members between an unlocked position in which the mating elements are disengaged from the projections, and a locked position in which the mating elements are engaged with the projections to inhibit rotation of the torque tube with respect to the housing.

2. The system of claim 1, wherein:
   the torque tube includes an axle that extends through the housing and is rotatable about an axis; and
   the rotation locking device includes a slider assembly, mounted on the axle, that is rotatable with the axle and is axially movable with respect to the axle.

3. The system of claim 2, wherein:
   the first locking member includes a first spline plate mounted on the slider assembly and the projections comprise a first set of face splines facing the second locking member;
   the second locking member includes a second spline plate mounted on the housing and the mating elements comprise a second set of face splines facing the slider assembly; and
   the actuator is coupled to the slider assembly and configured to move the slider assembly between an unlocked position in which the first spline plate of the first locking member is spaced from the second spline plate of the second locking member and the first set of face splines of the first locking member and the second set of face splines of the second locking member are disengaged, and a locked position in which the first spline plate of the first locking member is in contact with the second spline plate of the second locking member and the first set of face splines of the first locking member and the second set of face splines of the second locking member are engaged to inhibit rotation of the axle with respect to the housing.

4. The system of claim 3, wherein the axle includes a first set of axial splines on a radial outer surface, and the slider includes a second set of axial splines on a radial inner surface that mate with the first set of axial splines.

5. The system of claim 4, wherein the slider assembly includes:
   an annular body;
   a first end plate attached at a first end of the annular body;
   a second end plate attached at a second end of the annular body;
   a collar positioned on an outer surface of the annular body between the first end plate and the second end plate;
   a first wave spring positioned on the annular body between the collar and the first end plate; and
   a second wave spring positioned on the annular body between the collar and the second end plate.

6. The system of claim 5, wherein the collar is rotatable with respect to the annular body of the slider.

7. The system of claim 6, wherein the slider assembly includes a set of radially outwardly projecting pins, and wherein the housing includes a set of tracks for receiving the pins, each track of the set of tracks defining a ramp that extends in both a circumferential and an axial direction.

8. The system of claim 7, wherein the actuator is coupled to the collar of the slider to rotate the collar so that the pins follow the tracks to move the collar in a first axial direction when the collar is rotated in a first circumferential direction and to move the collar in a second axial direction when the collar is rotated in a second circumferential direction.

9. The system of claim 8, wherein the collar includes a gear segment, and wherein the actuator includes a pinion gear that engages the gear segment.

10. The system of claim 8, wherein the collar includes a drive arm that extends outwardly from the collar, and wherein the actuator includes a linear drive element connected to the drive arm.

11. The system of claim 1, wherein:
   the rotation locking device includes a bearing captured by the housing, the bearing having a smooth inner surface; and
   the torque tube extends through the bearing and is rotatable about an axis.

12. The system of claim 11, wherein:
   the first locking member comprises a first splined outer surface on the torque tube and a collar with an interior splined surface;
   the second locking member comprises a second splined outer surface on the bearing that is axially spaced for the first splined outer surface; and
   the actuator is coupled to the collar and configured to move the collar axially between an unlocked position in which the interior splined surface of the collar engages the first splined outer surface but not the second splined outer surface, and a locked position in which the interior splined surface of the collar engages both the first splined outer surface and the second outer splined surface to inhibit rotation of the torque tube with respect to the housing.

13. The system of claim 1, wherein:

the torque tube extends through the housing and is rotatable about an axis;

the first locking member comprises a ruffle disc attached to and rotatable with the torque tube, the ruffle disc having a plurality of circumferentially spaced face splines arranged in an arc with respect to the axis;

the second locking member comprises face splines configured to mate with face splines of the ruffle disc; and the actuator is configured to move the second locking member axially between an unlocked position in which the face splines of the second locking member are disengaged form the face splines of the ruffle disc, and a locked position in which the face splines of the second locking member are engaged with the face splines of the ruffle disc to inhibit rotation of the torque tube with respect to the housing.

14. The system of claim 1, wherein:

the torque tube extends through the housing and is rotatable about an axis;

the first locking member comprises a sprocket rigidly attached to an outer surface of the torque tube;

the second locking member is mounted on the housing and has a plurality of spaced pins carried in spaced slots; and the actuator is configured to move the second locking member between an unlocked position in which the pins of the second locking member are disengaged from teeth of the sprocket, and a locked position in which the pins of the second locking member are engaged with teeth of the sprocket to inhibit rotation of the sprocket and the torque tube with respect to the housing.

15. A rotation locking device including:

a housing;

an axle that extends through the housing and is rotatable about an axis;

a first locking member having a plurality of circumferentially spaced projections attached to and rotatable with the axle;

a second locking member connected to the housing and having a plurality of mating elements for engaging the projections of the first locking member; and an actuator configured to relatively move the first and second locking members between an unlocked position in which the mating elements are disengaged from the projections, and a locked position in which the mating elements are engaged with the projections to inhibit rotation of the axle with respect to the housing.

16. The device of claim 15, wherein:

the rotation locking device includes a slider assembly, mounted on the axle, that is rotatable with the axle and is axially movable with respect to the axle;

the first locking member includes a first spline plate mounted on the slider assembly and the projections comprise a first set of face splines facing the second locking member;

the second locking member includes a second spline plate mounted on the housing and the mating elements comprise a second set of face splines facing the slider assembly; and the actuator is coupled to the slider assembly and configured to move the slider between an unlocked position in which the first spline plate of the first locking member is spaced from the second spline plate of the second locking member and the first set of face splines of the first locking member and the second set of face splines of the second locking member are disengaged, and a locked position in which the first spline plate of the first locking member is in contact with the second spline plate of the second locking member and the first set of face splines of the first locking member and the second set of face splines of the second locking member are engaged to inhibit rotation of the axle with respect to the housing.

17. The device of claim 16, wherein the axle includes a first set of axial splines on a radial outer surface, and the slider assembly includes a second set of axial splines on a radial inner surface that mate with the first set of axial splines.

18. The device of claim 17, wherein the slider includes:

an annular body;

a first end plate attached at a first end of the annular body;

a second end plate attached at a second end of the annular body;

a collar positioned on an outer surface of the annular body between the first end plate and the second end plate, wherein the collar is rotatable with respect to the annular body of the slider;

a first wave spring positioned on the annular body between the collar and the first end plate; and a second wave spring positioned on the annular body between the collar and the second end plate.

19. The device of claim 18, wherein the slider assembly includes a set of radially outwardly projecting pins, and wherein the housing includes a set of tracks for receiving the pins, each track of the set of tracks defining a ramp that extends in both a circumferential and an axial direction.

20. The device of claim 19, wherein the actuator is coupled to the collar of the slider assembly to rotate the collar so that the pins follow the tracks to move the collar in a first axial direction when the collar is rotated in a first circumferential direction and to move the collar in a second axial direction when the collar is rotated in a second circumferential direction.

* * * * *